United States Patent
Mengue et al.

(10) Patent No.: US 11,139,756 B2
(45) Date of Patent: Oct. 5, 2021

(54) TRANSDUCERS WITH ELECTROSTATIC REPULSION AND ASSOCIATED SYSTEMS AND METHODS

(71) Applicant: Facebook Technologies, LLC, Menlo Park, CA (US)

(72) Inventors: Yigit Mengue, Kirkland, WA (US); Andrew John Ouderkirk, Redmond, WA (US); Christopher Yuan Ting Liao, Seattle, WA (US); Katherine Marie Smyth, Seattle, WA (US); Thomas John Farrell Wallin, Redmond, WA (US); Jack Lindsay, Seattle, WA (US); Austin Lane, Bellevue, WA (US); Tanya Malhotra, Redmond, WA (US); Kenneth Diest, Kirkland, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 374 days.

(21) Appl. No.: 16/215,684

(22) Filed: Dec. 11, 2018

(65) Prior Publication Data
US 2020/0186056 A1    Jun. 11, 2020

(51) Int. Cl.
H02N 1/00    (2006.01)
G02B 7/04    (2021.01)

(52) U.S. Cl.
CPC ............... H02N 1/006 (2013.01); G02B 7/04 (2013.01)

(58) Field of Classification Search
CPC .................................. H02N 1/006; G02B 7/04
USPC ....................................................... 310/309
See application file for complete search history.

(56) References Cited

U.S. PATENT DOCUMENTS

| | | | |
|---|---|---|---|
| 6,420,441 B1 | 7/2002 | Allen et al. | |
| 9,228,822 B2 | 1/2016 | Majidi et al. | |
| 2006/0024976 A1 | 2/2006 | Waldfried et al. | |
| 2007/0263963 A1 | 11/2007 | Hughes et al. | |
| 2008/0171431 A1 | 7/2008 | Yu et al. | |
| 2010/0075056 A1 | 3/2010 | Axisa et al. | |
| 2012/0029416 A1* | 2/2012 | Parker | A61L 27/56 604/20 |
| 2012/0306790 A1* | 12/2012 | Kyung | G06F 3/041 345/173 |
| 2014/0266647 A1* | 9/2014 | Visitacion | G08B 6/00 340/407.1 |

(Continued)

FOREIGN PATENT DOCUMENTS

WO    2016/123351 A1    8/2016

OTHER PUBLICATIONS

International Search Report and Written Opinion received for PCT Application Serial No. PCT/US2019/062925 dated Feb. 25, 2020, 13 pages.

(Continued)

*Primary Examiner* — Terrance L Kenerly
(74) *Attorney, Agent, or Firm* — FisherBroyles, LLP

(57) ABSTRACT

In some embodiments, a device, such as a transducer, includes a polymer element disposed between electrodes, and a control circuit configured to apply electrical potentials having the same polarity to the electrodes. A separation distance between the electrodes may be increased by an electrostatic repulsion between the electrodes. Various other devices, systems, methods, and computer-readable media are also disclosed.

17 Claims, 6 Drawing Sheets

(56) References Cited

U.S. PATENT DOCUMENTS

| | | |
|---|---|---|
| 2016/0187985 A1 | 6/2016 | Lim et al. |
| 2017/0090570 A1 | 3/2017 | Rain et al. |
| 2017/0192595 A1 | 7/2017 | Choi et al. |
| 2018/0093456 A1 | 4/2018 | Van Overmeere et al. |
| 2019/0361318 A1 | 11/2019 | Johnson et al. |
| 2020/0076328 A1 | 3/2020 | Cha et al. |

OTHER PUBLICATIONS

Mullin et al., "Pattern Transformation Triggered by Deformation", Physical Review Letters, vol. 99, No. 8, 084301, Aug. 22, 2007, 4 pages.

Babaee et al., "3D Soft Metamaterials with Negative Poisson's Ratio", Advanced Materials, vol. 25, No. 36, Jul. 22, 2013, pp. 5044-5049.

Bertoldi et al., "Negative Poisson's Ratio Behavior Induced by an Elastic Instability", Advanced Materials, vol. 22, No. 3, Jan. 13, 2010, pp. 361-366.

Overvelde et al., "Relating pore shape to the non-linear response of periodic elastomeric structures", Journal of the Mechanics and Physics of Solids, vol. 64, Mar. 2014, pp. 351-366.

Ren et al., "Design and characterisation of a tuneable 3D buckling-induced auxetic metamaterial", Materials & Design, vol. 139, Feb. 5, 2018, pp. 336-342.

Correa et al., "Negative stiffness honeycombs for reoverable shock isolation", Rapid Prototyping Journal, vol. 21, No. 2, Mar. 16, 2015, pp. 193-200.

Coulais et al., "Discontinuous Buckling of Wide Beams and Metabeams", Physical Review Letters, vol. 115, No. 4, Jul. 21, 2015, 7 pages.

Bickel et al., "Design and Fabrication of Materials with Desired Deformation Behavior", ACM Transactions on Graphics, vol. 29, No. 4, Article 63, Jul. 1, 2010, pp. 1-10.

Rosset et al., "Small, fast, and tough: Shrinking down integrated elastomer transducers", Applied Physics Review, vol. 3, No. 3, Article 031105, Sep. 26, 2016, pp. 1-20.

Plante et al., "Large scale failure modes of dielectric elastomer actuators", International Journal of Solids and Structures, vol. 43, Mar. 29, 2006, pp. 7727-7751.

Optotune, "Electroactive Polymers", URL: https://optotune.com/technology/electroactive-polymers, retrieved on Apr. 30, 2020, 3 pages.

Novasentis, "Haptic Actuators", URL: https://novasentis.com/product, retrieved on Apr. 30, 2020, 4 pagea.

Rosset et al., "Mechanical characterization of a dielectric elastomer microactuator with ion-implanted electrodes", Sensors and Actuators, A, vol. 144, No. 1, Jan. 14, 2008, pp. 185-193.

Gerratt et al., "Dielectric breakdown of PDMS thin films", Journal of Micromech and Microengineering, Technical Note, vol. 23, No. 6, Article 067001, Apr. 26, 2013, pp. 1-7.

Hunt et al., "A self-healing dielectric elastomer actuator", Applied Physics Letters, vol. 104, Article 113701, Mar. 19, 2014, pp. 1-3.

Skov et al., "Optimization Techniques for Improving the Performance of Silicone-Based Dielectric Elastomers", Advances Engineering Materials, vol. 20, No. 5, Article 1700762, Nov. 27, 2017, pp. 1-21.

Mazurek et al., "Glycerol as high-permittivity liquid filler in dielectric silicone elastomer", Journal of Applied Polymer Science, vol. 133, No. 43, Article 44153, Jul. 20, 2016, pp. 1-8.

Rao et al., "Synthesis of flexible silica aerogels using methyltrimethoxysilane (MTMS) precursor", Journal of Colloid and Interface Science, vol. 300, No. 1, Aug. 1, 2006, pp. 279-285.

Seo et al., "Reticulated Nanoporous Polymers by Controlled Polymerization-Induced Microphase Separation", Science, vol. 336, Jun. 15, 2012, pp. 1422-1425.

Jennings, S.G., "The Mean Free Path in Air", J. Aerosol Sci., vol. 19, No. 2, Apr. 2, 1988, pp. 159-166.

Gupta et al., "Nanoemulsions: Formation, Properties, and Applications", Soft Matter, vol. 12, No. 11, Feb. 23, 2016, pp. 1-17.

Helgeson et al., "Mesoporous organohydrogels from thermogelling photocrosslinkable nanoemulsions", Nature Materials, vol. 11, Feb. 12, 2012, pp. 1-9.

Guha et al., "Creating nanoscale emulsions using condensation", Nature Communications, vol. 8, Article 1371, Nov. 8, 2017, pp. 1-7.

Meier et al., "Microemulsion elastomers", Colloid and Polymer Science, vol. 274, Mar. 1, 1996, pp. 218-226.

Richter et al., "Design considerations of form birefringent microstructures", Applied Optics, vol. 34, No. 14, May 10, 1995, pp. 2421-2429.

Mahadik et al., "Elastic and Superhydrophobic Monolithic Methyltrimethoxysilane-based Silica Aerogels by Two-step Sol-gel Process", J. Microelectron. and Packaging Soc., vol. 23, No. 1, Mar. 30, 2016, pp. 35-39.

Jeon et al., "Three dimensional nanoporous density graded materials formed by optical exposures through comformable phase masks", Applied Physics Letters, vol. 89, Article 253101, Dec. 18, 2006, pp. 1-3.

Sultan et al., "Electrical Breakdown Testing of Materials Intended for use in PV Modules", 3rd Atlas/NIST Workshop on Photovoltaics, Dec. 8-9, 2015, 29 pages.

Sekitani et al., "Stretchable active-matrix organic light-emitting diode display using printable elastic conductors", Nature Materials, vol. 8, May 10, 2009, pp. 494-499.

Someya et al., "Conformable, flexible, large-area networks of pressure and thermal sensors with organic transistor active matrixes", PNAS, vol. 102, No. 35, Aug. 30, 2005, pp. 12321-12325.

Wegener et al., "Controlled inflation of voids in cellular polymer ferroelectrets: Optimizing electromechanical transducer properties", Applies Physics Letters, vol. 84, No. 3, Jan. 19, 2004, pp. 392-394.

Wu et al., "Fabrication of ultralong perovskite structure nanotubes", RSC Advances, vol. 8, Jan. 2, 2018, pp. 367-373.

Wu et al., "Efficient multi-barrier thin film encapsulation of OLED using alternating Al2O3 and polymer layers", RSC Advances, vol. 8, Feb. 2, 2018, pp. 5721-5727.

Yang et al., "Harnessing Surface Wrinkle Patterns in Soft Matter", Advanced Functional Materials, vol. 20, Jul. 29, 2010, pp. 2550-2564.

Zhang et al., "Highly Porous Polyhedral Silsesquioxane Polymers. Synthesis and Characterization", J. Am. Chem. Soc., vol. 120, Aug. 11, 1998, pp. 8380-8391.

Yang et al., "Avoiding the pull-in instability of a dielectric elastomer film and the potential for increased actuation and energy harvesting", Soft Matter, vol. 13, Jan. 6, 2017, pp. 4552-4558.

Wu et al., "3D Printed Silicones with Shape Memory", Scientific Reports, vol. 7, Article 4664, Jul. 5, 2017, pp. 1-6.

Jang et al., "Mechanically Tunable Three-Dimensional Elastomeric Network/Air Structures via Interference Lithography", Nano Letters, vol. 6, No. 4, Mar. 15, 2006, pp. 740-743.

Rogers et al., "Materials and Mechanics for Stretchable Electronics", Science, vol. 327, Mar. 26, 2010, pp. 1603-1607.

Wolak et al., "Dielectric response of structured multilayered polymer films fabricated by forced assembly", Applied Physics Letters, vol. 92, Article 113301, Mar. 17, 2008, pp. 1-3.

Mackey et al., "Enhanced breakdown strength of multilayered films fabricated by forced assembly microlayer coextrusion", Journal of Physics D: Applied Physics, vol. 42, Article 175304, Aug. 12, 2009, pp. 1-12.

\* cited by examiner

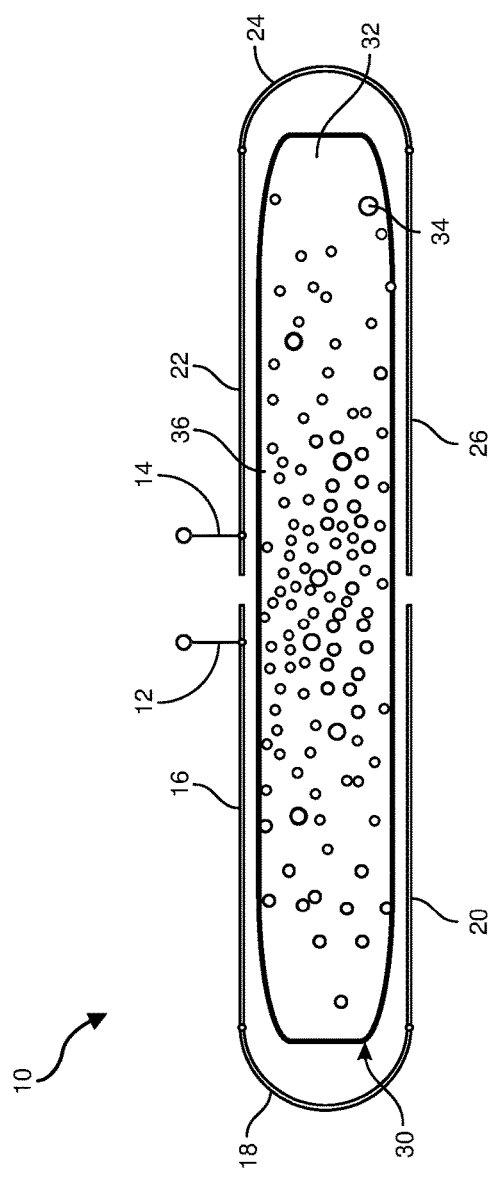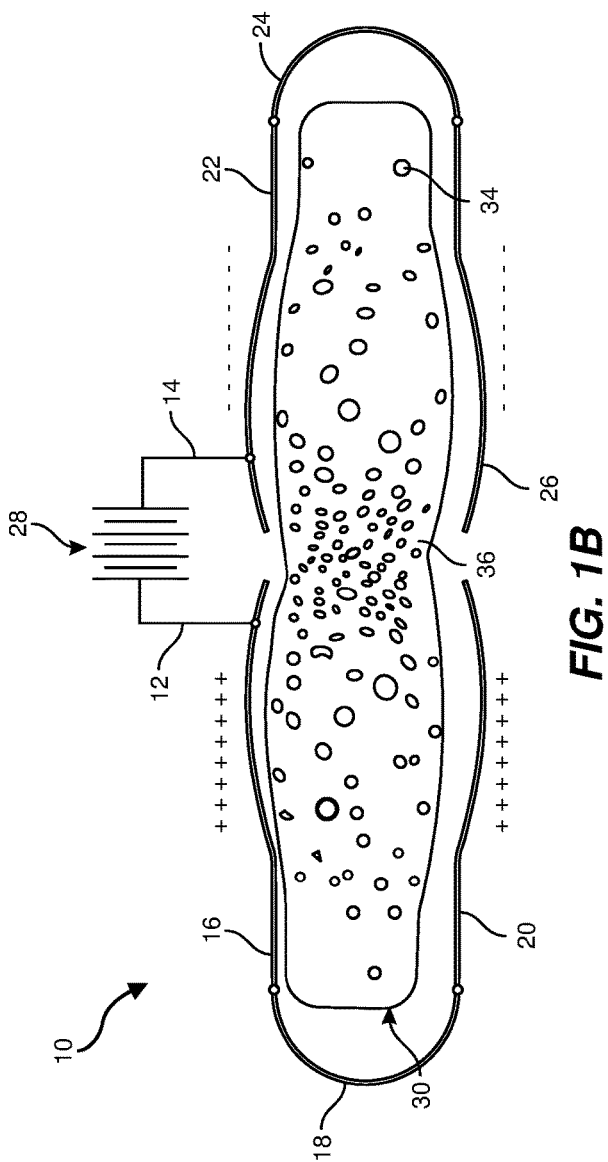

↓ Apply Field

TRANSDUCERS WITH ELECTROSTATIC REPULSION AND ASSOCIATED SYSTEMS AND METHODS

BACKGROUND

Augmented reality (AR) and virtual reality (VR) systems, which may include devices such as gloves and headsets, may enable users to experience events, such as interacting with people in a computer-generated simulation of a three-dimensional world, or viewing AR data superimposed on a real-world view. AR/VR devices may also be used for purposes other than recreation. For example, governments may use such devices for military training simulations, doctors may use such devices to practice surgery, and engineers may use such devices them as visualization aids. AR/VR devices may include transducers and optical assemblies. Thus, there is a desire to improve such devices, along with systems and methods using such devices

SUMMARY

As will be described in greater detail below, the instant disclosure describes example transducers using electrostatic repulsion between electrodes, for example, to generate displacement.

In some embodiments, a device includes a first electrode, a second electrode, a polymer element disposed between the first electrode and the second electrode, and a control circuit configured to apply a first electrical potential to the first electrode and a second electrical potential to the second electrode. The first electrode and the second electrode may be separated by a separation distance, for example, when no electrical potential us applied to either electrode. The separation distance may be increased by an electrostatic repulsion between the first electrode and the second electrode when the first electrical potential is applied to the first electrode and the second electrical potential is applied to the second electrode. The first electrical potential and the second electrical potential may have the same polarity. For example, both the first and second electrical potentials may both have positive polarity, or may both have negative polarity. The first electrical potential and the second electrical potential may be substantially identical. The first electrode and the second electrode may be electrically interconnected, and the control circuit configured to apply a common electrical potential to both the first electrode and the second electrode.

In some embodiments, the polymer element may include an electroactive polymer, and may be an electroactive element. In some embodiments, the polymer element may be generally homogeneous. In some embodiments, the polymer element may include a plurality of nanovoids. The plurality of nanovoids may be generally uniformly distributed within the polymer element. In some embodiments, the device may provide a non-uniform mechanical response to application of the first electrical potential to the first electrode and the second electrical potential to the second electrode, based on a non-uniform distribution of voids within the polymer element. The first electrode may be disposed on a first substrate and the second electrode may be disposed a second substrate. The first and/or second substrate may include a flexible polymer film. The device may be a component of a wearable device, such as a glove, belt, strap, glasses or a head-mounted device, shoe, helmet, watch, or other clothing item or wearable device. The device may be positioned adjacent to a second device, the electroactive device and the second device cooperatively providing a cumulative displacement when both devices are actuated. The second device may be an electroactive device based on an electroactive polymer.

In some embodiments, a transducer may include a first device including a first pair of electrodes, a second device including a second pair of electrodes, and a control circuit configured to apply a first electrical potential to each electrode of the first pair of electrodes and a second electrical potential between the second pair of electrodes, wherein a first distance between the first pair of electrodes is increased by electrostatic repulsion when the first electrical potential is applied to each electrode of the first pair of electrodes, and a second distance between the second pair of electrodes is increased and/or decreased when the second electrical potential is applied between the second pair of electrodes. The second device may include a polymer element located between the second pair of electrodes, which may be an electroactive element. The device may include a polymer element located between the first pair of electrodes, which may be an electroactive element, a non-electroactive dielectric element, or other polymer element. The first pair of electrodes may include a first electrode and a second electrode, with the first electrode disposed on a first substrate, the second electrode disposed on a second substrate, and where the first substrate and the second substrate each include a flexible polymer.

In some embodiments, a method (such as a method of electrical actuation) includes applying a first electrical potential to a first electrode, and applying, during application of the first electrical potential to the first electrode, a second electrical potential to a second electrode, wherein the first electrical potential has the same polarity as the second electrical potential, thereby inducing a repulsive electrostatic force between the first electrode and the second electrode, and thereby increasing a separation distance between the first electrode and the second electrode. In some embodiments, there may be a polymer element disposed between the first electrode and the second electrode. A method may further include subsequently applying electrical potentials having opposite polarities to the first electrode and the second electrode respectively, thereby inducing an attractive force between the first electrode and the second electrode. The polymer element may include an electroactive polymer, and the attractive force may result, at least in part, from an electrically induced compression of the polymer element.

In some embodiments, a computer-implemented method for applying an electrostatic repulsion-based actuation may include receiving a control signal, for example, from a logic unit. The control signal may relate to desired application of haptic feedback to a person, for example, in various embodiments where the actuator may be part of a wearable device such as a glove, belt, glasses, other headwear, footwear, or other wearable device. The control signal may be generated by, or otherwise based on the output of, an AR or VR system. The actuator signal to be applied to the actuator may then be determined based on the control signal. The actuator signal may correspond to providing one or more electrical potentials to one or more electrical contacts of an actuator, for example, as described herein. The actuator signal may then be applied to the actuator, for example, through one or more electrical contacts. The actuator signal may be time-modulated to provide a further desired haptic sensation to the person, for example, based on the control signal. In some embodiments, a system for actuation may include several modules stored in memory, including a control element, logic unit, or other processor-based device. In some embodiments, a method may be encoded as computer-readable instructions on a computer-readable medium. For example, a computer-readable medium may include one or more computer-executable instructions that, when executed by at least one processor of a computing device, may cause the computing device to control the provision of actuator signals to an actuator.

While the exemplary embodiments described herein are susceptible to various modifications and alternative forms, specific embodiments will be described in detail herein. However, the exemplary embodiments described herein are not intended to be limited to the particular forms disclosed. Rather, the instant disclosure covers all modifications, equivalents, and alternatives falling within this disclosure.

Features from these and any of the other embodiments disclosed herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIGS. 1A and 1B illustrate an electrostatic actuator, where FIG. 1A shows no electric signal applied and FIG. 1B shows an electric signal applied.

Figures 2A, 2B:
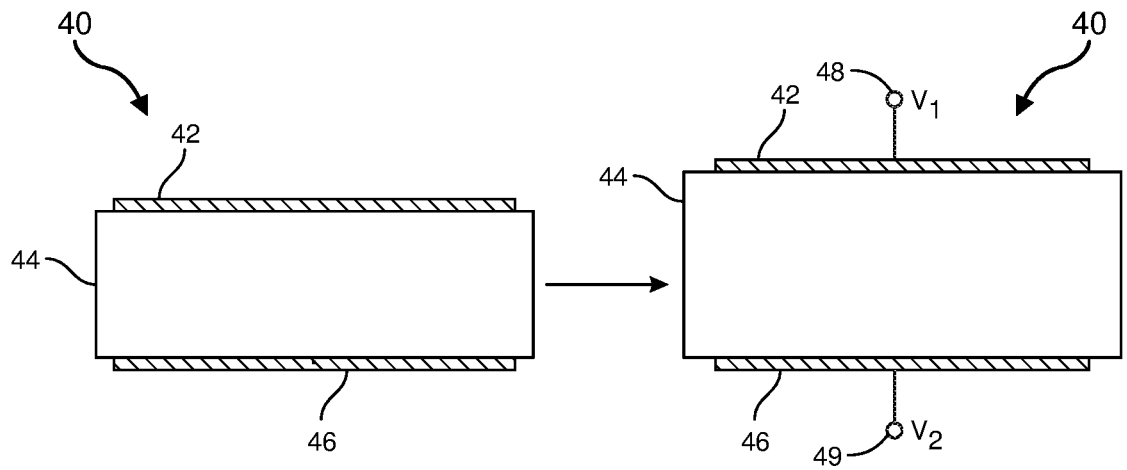
FIGS. 2A and 2B illustrate a 2-electrode electrostatic actuator.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to, for example, transducers such as actuators, and associated systems and methods. As will be explained in greater detail below, embodiments of the instant disclosure include electrostatic actuators, in which electrostatic repulsion between like charges induces a displacement.

The following will provide, with reference to FIGS. 1-9, detailed descriptions of example transducers, systems including one or more transducers, methods of using transducers, and methods of fabricating transducers.

In some embodiments, a transducer, such as an actuator, includes a pair of spaced-apart electrodes, and a control circuit configured to apply of voltages of the same polarity to each electrode of the pair of spaced-apart electrodes. The similar electrical polarities may induce an electrostatic repulsion between the pair of spaced-apart electrodes. The electrodes may be electrically interconnected, e.g., to a common electrode, so that a common electrical potential is applied both electrodes. The common electrical potential may be a positive or negative electrical potential. A non-actuated device may be disconnected from any external voltage source, or, for example, a common ground potential may be applied to both electrodes. The electrostatic repulsion induced by like potentials may induce an appreciable increase in electrode separation. An electrode may be formed on or otherwise mechanically coupled to a substrate. Electrostatic repulsion may induce displacement of a substrate mechanically coupled to, or otherwise associated with, an electrode. A dielectric material, such as a dielectric layer, for example, a polymer layer (including, e.g., a dielectric polymer and/or an electroactive polymer) may be located between the electrodes. The polymer layer may be nanovoided, using either an open or closed cell configuration. Nanovoids may be patterned to achieve a spatially-varying transducer response, such as transduction having a magnitude correlated with the volume density (or other parameter, such as number density, size, and the like) of the voids. The polymer layer may have either a positive or negative Poisson's ratio. Applying voltages of the same polarity prevents the problem of electrostatic pull-in. A plurality of such devices may be stacked to increase the electrically-induced displacement. For example, a device may be stacked on top of another similar device. Adjacent devices may be separated by an insulating layer. Device(s) configured to operate using electrostatic repulsion may be combined with one or more devices using electrically-induced compression (e.g., of an EAP layer using a potential difference). For example, an outwards convex curvature of an expanding device, driven by electrostatic repulsion, may be mechanically coupled to a complementary inwards concave curvature of a device using electrically-induced compression of an electroactive element (such as an electroactive polymer layer).

In some embodiments, a device, such as a transducer, for example, an actuator, includes a first electrode, a second electrode, and a control circuit configured to apply electrical potentials having the same polarity to both the first electrode and the second electrodes, so that the first and second electrodes are urged apart by electrostatic repulsion. In some embodiments, a dielectric material (such as a dielectric layer, such as a polymer layer) is located between the first and second electrodes. In some embodiments, the dielectric is homogenous, and may be, for example, a generally uniform polymer layer. In some embodiments, the dielectric material includes a plurality of voids, such as nanovoids. The voids may be uniformly distributed. In some embodiments, the voids may have a non-uniform distribution. In some embodiment, a device may include layers of interleaved homogenous and nanovoided dielectric layers. In some embodiments, an interleaved or stacked device may use both electrostatic repulsion and attraction to cooperatively induce actuation in the same direction.

A distribution of voids, such as nanovoids, may be used to reduce the rigidity of a dielectric layer (such as a polymer layer, such as a polymer elastomer layer), allowing increased actuation for a given electrical input, for example, a greater increase in the gap between the electrodes, or equivalently the same actuation for a reduced electrical input, compared with a homogeneous non-voided dielectric layer. A control circuit including appropriate drive electronics can induce the same charge to both electrodes and actuate a device with repulsive and/or attractive electrostatic forces, for example, using similar or opposite polarities respectively.

In some embodiments, voids (such as nanovoids) can be open or closed cell. Voids may be disordered (for example, in an array) or ordered. Operation using electrostatic repulsion may be naturally stable since electrostatic pull-in is impossible. The dielectric material, for example, in the form of a polymer element, can exhibit positive or negative Poisson's ratio. Voids can exhibit positive or negative Poisson's ratio. Device operation may be naturally "muscle-like" for positive Poisson ratio nanovoids. In some embodiments, actuation (such as displacement) may be enhanced by combining the actuation from multiple devices, for example, by placing actuators adjacent to each other, for example, by stacking actuators. Actuation may be combined either in-plane or out-of-plane, for example, using replicated structures.

FIGS. 1A and 1B illustrate an electrostatic actuator 10. FIG. 1A shows no voltage source in connection with the electrostatic actuator 10, and FIG. 1B shows a voltage source 28 electrically connected to the electrostatic actuator 10.

FIG. 1A shows an electrostatic actuator 10 including a first electrode assembly and a second electrode assembly. The first electrode assembly includes a first pair of spaced-apart electrodes (electrodes 16 and 20) electrically interconnected by electrode interconnection 18. Similarly, the second electrode assembly includes a second pair of spaced-apart electrodes (electrodes 22 and 26) electrically interconnected by electrode interconnection 24. The electrostatic actuator 10 further includes a polymer element 30, including polymer 32 and an arrangement of voids (such as void 34) distributed through the polymer element 30. The polymer element 30 has a central portion 36 that has a greater volume fraction of voids than surrounding edge portions. The first pair of spaced-apart electrodes includes a first electrode 16 and a second electrode 20, which are at the same electrical potential due to the electrical interconnection 18. Similarly, the second pair of spaced-apart electrodes includes electrodes 22 and 26, which are at the same electrical potential due to electrode interconnection 24. First and second electrical connectors 12 and 14 are electrically connected to the first and second electrode assemblies, respectively. In FIG. 1A, the electrical connectors not connected to a voltage source and the device is not actuated.

FIG. 1B show the electrostatic actuator 10, with an external voltage source 12 connected to the first and second electrode assemblies through first and second electrical connectors 12 and 14, respectively. As illustrated, a positive voltage source is connected to the first electrode assembly, and a negative voltage source is connected to the second electrode assembly. The positive and negative symbols in FIG. 1B are used to symbolically illustrate the electrical potential of the first and second electrode assemblies, respectively. The figure shows the pairs of spaced apart electrodes being repelled by each other due to the electrostatic repulsion between like charges. The central portion shows a degree of constriction due to the electrical potential between each electrode assembly.

The mechanical response of an electrostatic actuator depends on one or more parameters, such as applied voltage, physical extent and patterning of electrodes, and properties of the polymer element (such as dielectric properties and/or mechanical properties). For example, in relation to FIG. 1B, there may be electro-constriction between the first and second electrode assemblies, due to the opposite polarities, if the polymer element includes an electroactive polymer. However, if the polymer element is not electroactive, there may be some electrostatic attraction, but no appreciable electro-constriction.

FIGS. 2A and 2B illustrate a two-electrode electrostatic actuator. FIG. 2A shows an electrostatic actuator 40 including a polymer element 44 located between a first electrode 42 and a second electrode 46. FIG. 2B shows the device 40 actuated, with the same polarity voltages (e.g., $V_1=V_2$) applied to both the first electrode 42 and the second electrode 46, through first electrical contact 48 and second electrical contact 49, respectively. Electrostatic repulsion induces an increase in electrode separation, the distance between first electrode 42 and the second electrode 46 (and any substrate associated with a respective electrode). For example, the electrode separation may be $d_1$ with no electrostatic repulsion, and $d_2$ with electrostatic repulsion, where $d_2>d_1$. In some embodiments, the polymer element 44 may include a dielectric polymer. In some embodiments, the polymer element may be an electroactive element (for example, including an electroactive polymer) and the electrode separation may be appreciably reduced by applying an electrical potential between the first and second electrodes (e.g., $V_1=-V_2$, $V_1=-+V$ or $-V$, $V_2=0$, or other potential difference.)

The polymer element may include a plurality of voids, for example, to reduce the rigidity of the polymer element and increase the degree of actuation (e.g., electrode separation change) for a given electrical input. A uniform distribution of voids may allow uniform actuation over the device. In some embodiments, the volume fraction of the voids is not-uniform, and there may be greater actuation in device portions corresponding to a higher volume fraction of voids.

Figure 3:
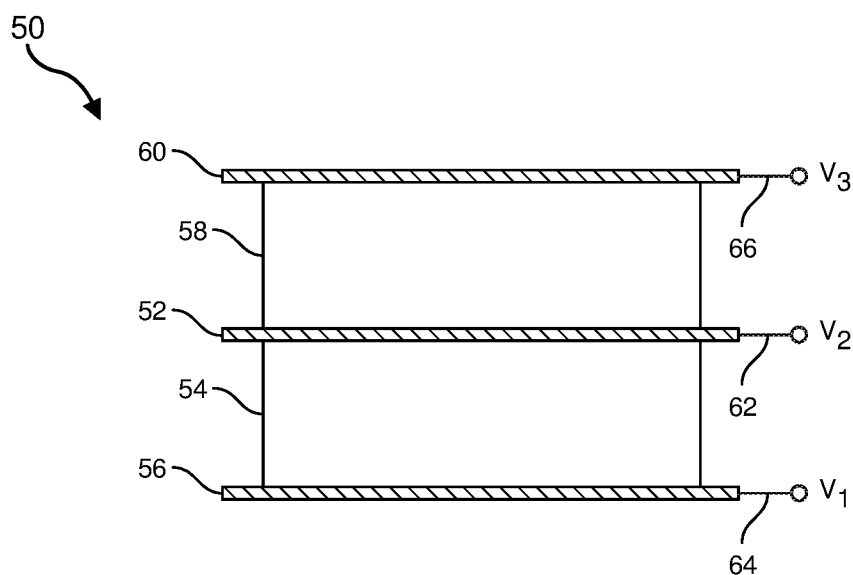
FIG. 3 illustrates a 3-electrode electrostatic actuator having a stacked configuration.

FIG. 3 illustrates a 3-electrode electrostatic actuator having a stacked configuration. FIG. 3 shows an actuator assembly 50 including first electrode 52, first polymer element 54, and second electrode 56. The assembly further includes a second polymer element 58 and third electrode 60. There are three electrical contacts (first electrical contact 62, second electrical contact 64, third electrical contact 66) connected to first, second, and third electrodes respectively. The combination of first polymer element and first and second electrodes and electrical contacts may be similar to the device described above in relation to FIGS. 2A and 2B, and may be operated as an electrostatic actuator. Actuation may include application of the same polarity voltages (e.g., $V_1=V_2$) to both the first electrode 52 and the second electrode 56, through first electrical contact 62 and second electrical contact 64, respectively. Electrostatic repulsion induces an increase in the distance between first electrode 52 and the second electrode 56. The second polymer element 58, first electrode 52, and third electrode 60 may be operated in an analogous manner. Actuation may include application of the same polarity voltages (e.g., $V_1=V_3$) to both the first electrode 52 and the third electrode 60, through first electrical contact 62 and third electrical contact 66, respectively. Electrostatic repulsion induces an increase in the distance between first electrode 52 and the third electrode 60. Hence, the stacked arrangement may be used to obtain a cumulative displacement that is the sum of the increase in distance between the first and second electrodes and the increase in the distance between the first and third electrodes.

In some embodiments, an actuator includes an alternating stack of polymer elements and electrodes (with electrodes top and bottom, at the stack extremities, so that there is one more electrode than polymer element). Application of same polarity electrical potentials (for example, equal electrical potentials) to all electrodes allows a cumulative displacement between top and bottom electrodes to be obtained.

Figure 4:
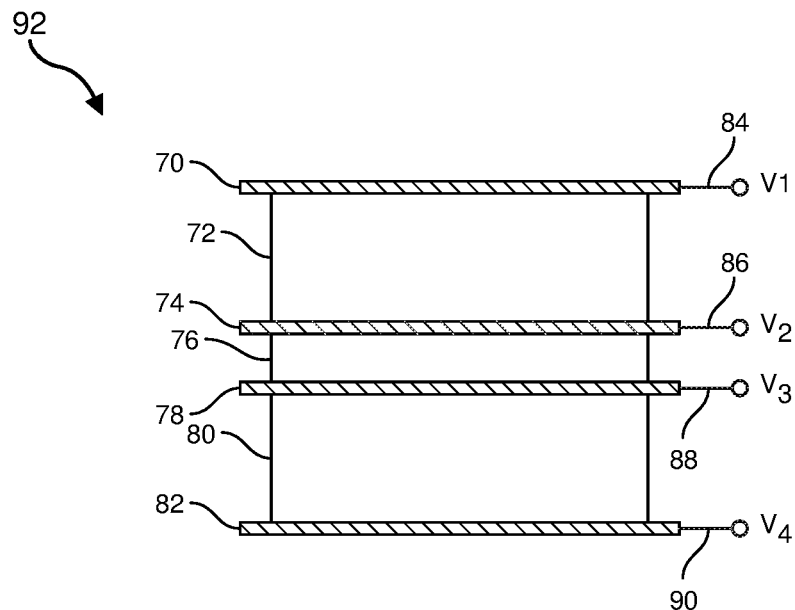
FIG. 4 illustrates a 4-electrode electrostatic actuator having a stacked configuration.

FIG. 4 illustrates a 4-electrode electrostatic actuator having a stacked configuration. The actuator 92 includes first electrode 70, first polymer element 72, second electrode 74, dielectric layer 76, third electrode 78, second polymer element 80, and fourth electrode 82. Electrical contacts 84, 86, 88, and 90 allow electrical potentials to be applied to first through fourth electrode respectively. Applying the same electrical potential to each electrode, the actuator may function in a similar manner to the device discussed above in relation to FIG. 3. However, using this configuration it is possible to apply, e.g., positive electrical potentials to the first and second electrodes and negative potentials to the third and fourth electrodes, or vice versa.

Figure 5:
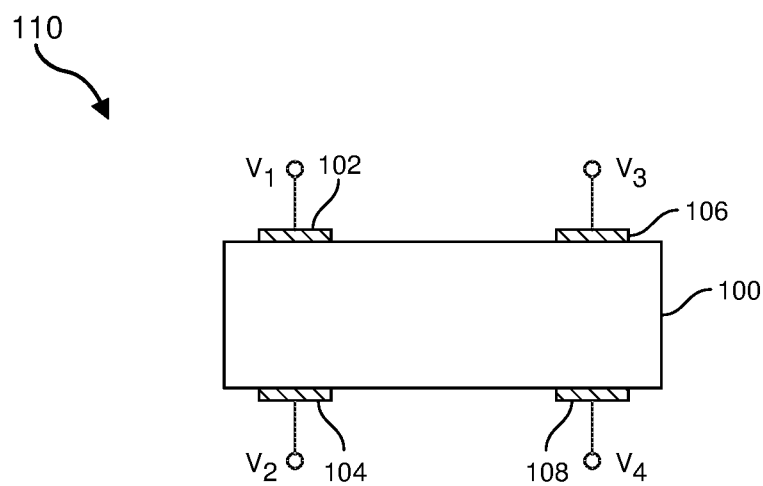
FIG. 5 illustrates a further 4-electrode electrostatic actuator.

FIG. 5 illustrates a further 4-electrode actuator. The actuator 110 includes a polymer element 100 and four electrodes 102, 104, 106, and 108. Electrodes 102 and 104 form a first spaced apart pair, and electrodes 106 and 108 form a second spaced apart pair. Applying the same electrical potential to each electrode of a spaced apart pair of electrodes induces electrostatic repulsion between the electrodes. Actuation of the left and right halves of the device, based on electrostatic repulsion, may be independently controlled. If the polymer element is an electroactive element, electrical potentials may be applied between any pair of electrodes (e.g., between electrodes 102 and 104, 102 and 108, 102 and 106, 104 and 106, 104 and 108, 106 and 108) to obtain a wide variety of electrically controllable actuation. For example, applied an electrical potential between electrodes 102 and 106 may induce a constriction along the top surface of the polymer element, and in some embodiments a bending deformation of the actuator 110. Similarly, an electrical potential between electrodes 104 and 108 may induce a constriction along the bottom surface of the polymer element, and in some embodiments a bending deformation in an opposite direction. An electrical potential applied between any spaced apart pair of electrodes may induce constriction of a corresponding portion of the electroactive element between that pair of electrodes.

Figure 6:
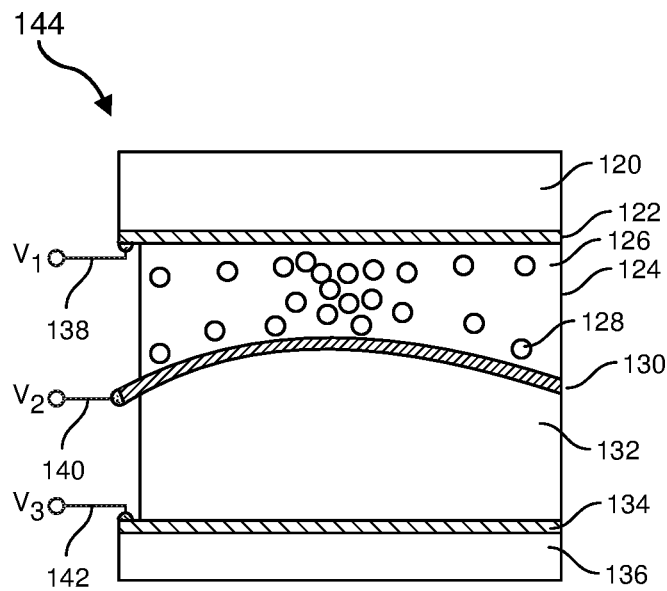
FIG. 6 shows a combination of an electrostatic actuator and an electroactive actuator.

FIG. 6 shows an actuator that combines the simultaneous operation of electrostatic repulsion and attraction. The actuator 144 includes a first substrate 120, first electrode 122, electroactive polymer element 124 (including electroactive polymer 126 and a plurality of voids such as void 128), second electrode 130 (also termed here a common electrode), dielectric polymer element 132, third electrode 134, and second substrate 136. Electrical contacts 138, 140, and 142 provide electrical connections to respective electrodes. The electroactive polymer element may have a non-uniform distribution of voids, with a higher volume fraction of voids in a central portion. This reduces the rigidity of the central portion, compared with edge portions. An electrical potential may be applied across the electroactive polymer element, inducing a deformation of the common electrode that shows a greater deformation in the central portion, as illustrated. In some examples, the upper and lower substrates may be assumed to be rigid. Similar electrical potentials are applied to the common electrode 130 and the third electrode 134, inducing electrostatic repulsion between the common electrode 130 and the third electrode 134. This actuation may cooperate with the electroactive actuation discussed above to enhance deformation of the common electrode 130. In some embodiments, the common electrode may also act as a mirror, either a convex mirror as viewed from above, or a concave mirror as viewed from below. Accordingly, the actuator 144 may provide a mirror with an electrically adjustable focal length. In some embodiments, the dielectric polymer may have a similar distribution of voids. In some embodiments, the polymer element 132 may be an electroactive polymer layer, allowing the sign of the radius of curvature of the common electrode to be reversed, e.g., by applying an electrical potential between the common electrode 130 and the third electrode 134, and the same electrical potential to the common electrode 130 and the first electrode 122.

Figure 7A:
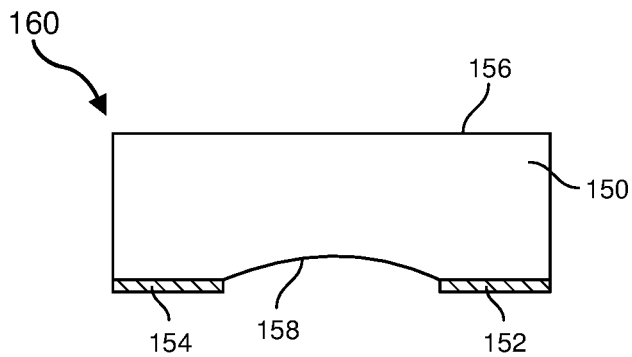
FIGS. 7A and 7B show a lateral field electroactive actuator with out-of-plane actuation.
Figure 7B:
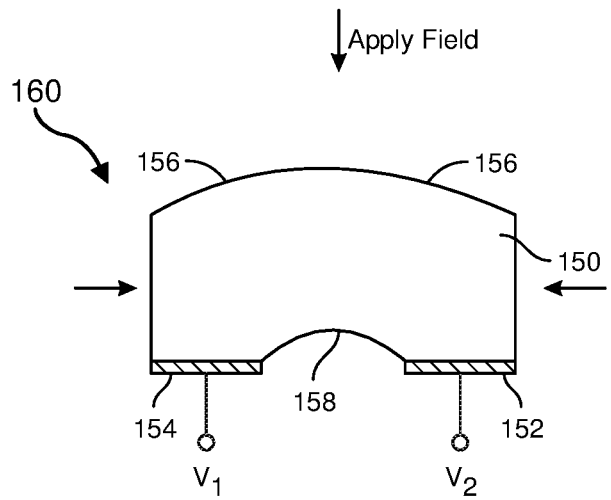

FIGS. 7A and 7B show a lateral field electroactive actuator with out-of-plane actuation. The figure shows an actuator 160 including polymer element 150 in a non-actuated state (with no electrical potential applied), in which the polymer element 150 has, for example, a flat top surface 156 and a concave base surface 158. In this example, the polymer element is an electroactive element. Application of an electrical potential between electrodes 154 and 152 may induce a lateral compression of the polymer element 150. In this embodiment, the lateral compression may increase the concave deformation of the base surface 158 and introduce a convex curvature of the top surface 156. This deformation may be used to control deformation of a reflective surface (e.g., as part of a flexible mirror), or a deformable lens. In some embodiments, the electrodes may be located instead on the sides of a polymer element.

Figure 8:
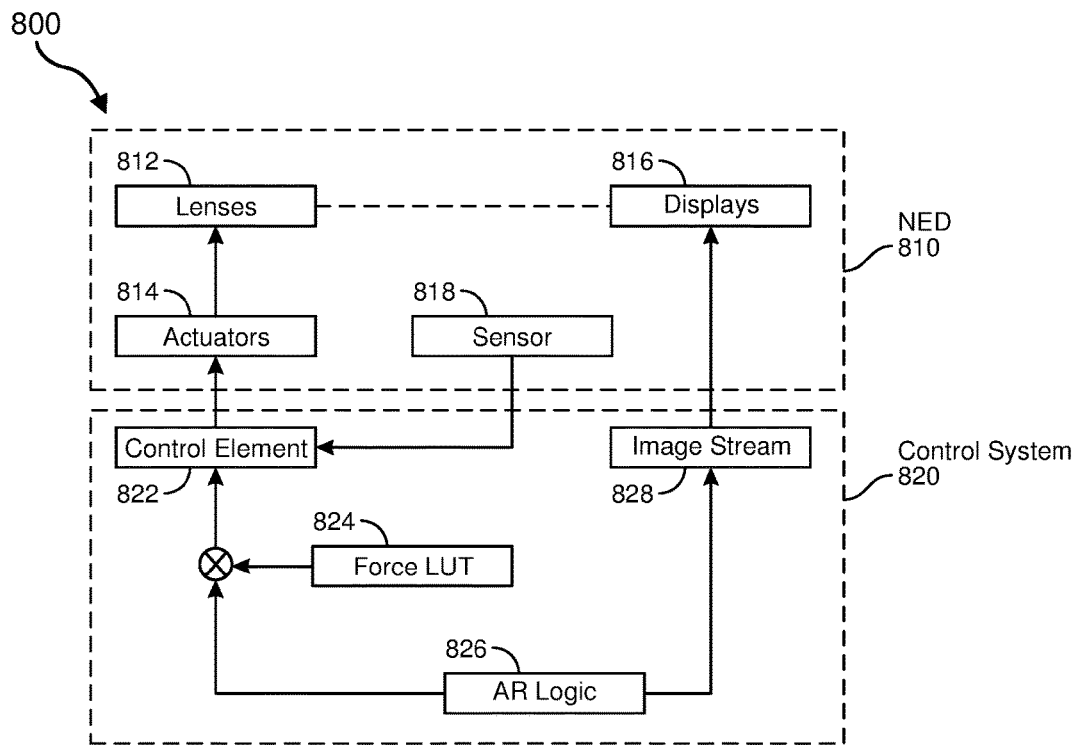
FIG. 8 shows a diagram of an example near-eye display system including a near-eye display and a control system, which may be communicatively coupled to each other, in accordance with some embodiments of the disclosure.

As shown in FIG. 8, a near-eye display system 800 may include a near-eye display (NED) 810 and a control system 820, which may be communicatively coupled to each other. The near-eye display 810 may include lenses 812, devices 814 (which may include an electroactive device, electrostatic actuator, combination thereof, or other device), displays 816, and a sensor 818. Control system 820 may include a control element 822, a force lookup table 824, and augmented reality (AR) logic 826.

Augmented reality logic 826 may determine what virtual objects are to be displayed and real-world positions onto which the virtual objects are to be projected. Accordingly, augmented reality logic 826 may generate an image stream 828 that is displayed by displays 816 in such a way that alignment of right- and left-side images displayed in displays 816 results in ocular vergence toward a desired real-world position.

Control element 822 may use the same positioning information determined by augmented reality logic 826, in combination with force lookup table (LUT) 824, to determine an amount of force to be applied by devices 814 (e.g., including one or more electroactive and/or electrostatic actuators), as described herein, to lenses 812. Devices 814 may, responsive to control element 822, apply appropriate forces to lenses 812 to adjust the apparent accommodation distance of virtual images displayed in displays 816 to match the apparent vergence distance of the virtual images, thereby reducing or eliminating vergence-accommodation conflict. Control element 822 may be in communication with sensor 818, which may measure a state of the adjustable lens. Based on data received from sensor 818, the control element 822 may adjust devices 814 (e.g., as a closed-loop control system).

In some examples, display system 800 may display multiple virtual objects at once and may determine which virtual object a user is viewing (or is likely to be viewing) to identify a virtual object for which to correct the apparent accommodation distance. For example, the system may include an eye tracking system (not shown) that provides information to control element 822 to enable control element 822 to select the position of the relevant virtual object.

Additionally or alternatively, augmented reality logic 826 may provide information about which virtual object is the most important and/or most likely to draw the attention of the user (e.g., based on spatial or temporal proximity, movement, and/or a semantic importance metric attached to the virtual object). In some examples, the augmented reality logic 826 may identify multiple potentially important virtual objects and select an apparent accommodation distance that approximates the virtual distance of a group of the potentially important virtual objects.

Control system 820 may represent any suitable hardware, software, or combination thereof for managing adjustments to adjustable lenses 812. In some examples, control system 820 may represent a system on a chip (SOC). As such, one or more portions of control system 820 may include one or more hardware modules. Additionally or alternatively, one or more portions of control system 820 may include one or more software modules that perform one or more of the tasks described herein when stored in the memory of a computing device and executed by a hardware processor of the computing device.

Control system 820 may generally represent any suitable system for providing display data, augmented reality data, and/or augmented reality logic for a head-mounted display. In some examples, control system 820 may include a graphics processing unit (GPU) and/or any other type of hardware accelerator designed to optimize graphics processing.

Figure 9:
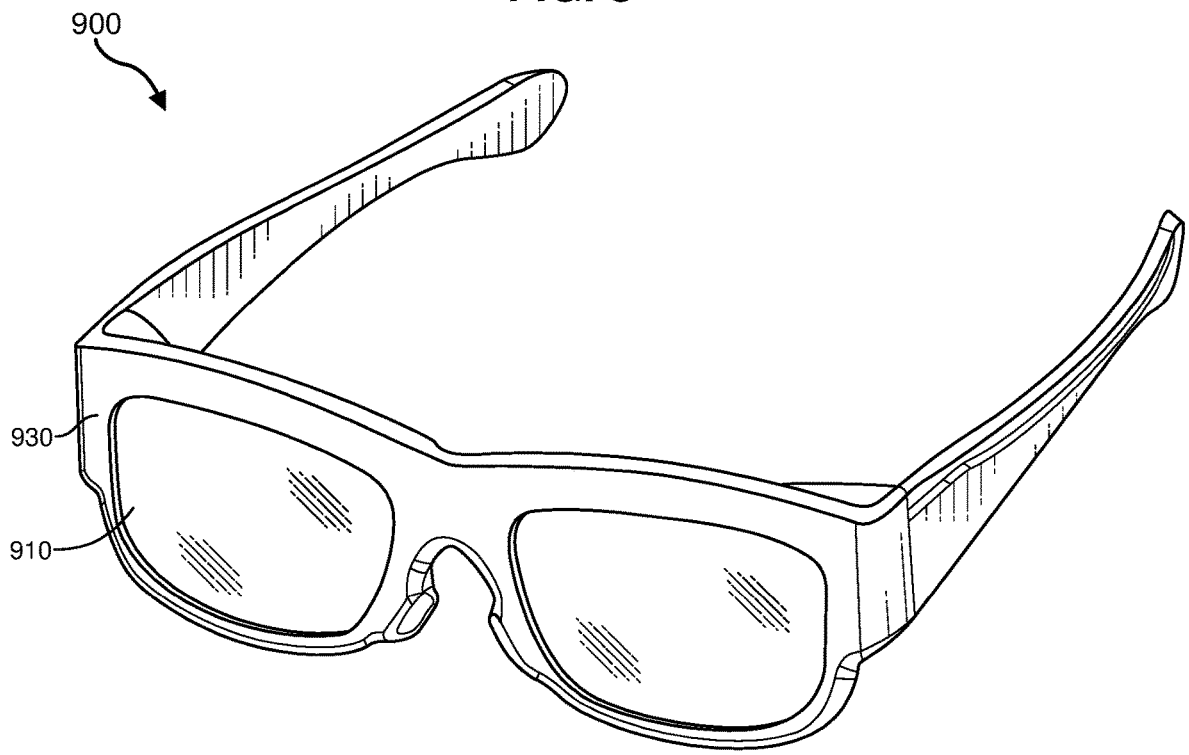
FIG. 9 shows a diagram of an example near-eye-display having lenses including a lens assembly with multiple liquid lenses, in accordance with some embodiments of the disclosure.

Control system 820 may be implemented in various types of systems, such as the augmented reality glasses 900 illustrated in FIG. 9. As shown, glasses 900 may include adjustable-focus lenses 910 coupled to a frame 930 (e.g., at an eyewire, not shown). In some embodiments, control system 820 of FIG. 8 may be integrated into frame 930. Alternatively, all or a portion of control system 820 may be in a system remote from glasses 900 and configured to control devices (e.g., electroactive and/or electrostatic actuators) in glasses 900 via wired or wireless communication.

In some embodiments, each of lenses 910 may include, for example, an optical fluid encapsulated by an elastomeric membrane and an optically clear and rigid back substrate. Actuation along the perimeter of lenses 910 (e.g., using one or more devices as further shown and described herein) may change the curvature (and thus the optical power) of the lenses, with positive and negative shapes determined by the direction of the applied force. In an embodiment, a membrane surface may be non-planar (e.g., concave or convex) at rest (e.g., at zero electrical power). In one example, a membrane surface may be non-planar when a substrate is curved.

Devices (such as actuators using electrostatic repulsion) mounted in frame 930 (e.g., in an eyewire) may deform each lens, with high optical quality achieved through tailored displacement and deflection, and via perimeter mounting for an asymmetric clear aperture including, for example, an RGB (red-green-blue) waveguide.

Control system 820 of FIG. 8 may trigger devices to adjust lenses (e.g., lenses 910) to help address the vergence-accommodation conflict. The vergence-accommodation conflict may result from how humans perceive depth. When a human eye fixates on an object, it accommodates to that object—that is, it changes focal distance to bring that object into focus. That accommodation is a visual cue to depth: objects that are much closer or further away than that distance are out of focus on the retina. This "retinal blur" is a cue that objects are at a different distance than the accommodative distance, although the cue is ambiguous as to whether the objects are closer or more distant.

Figure 10:
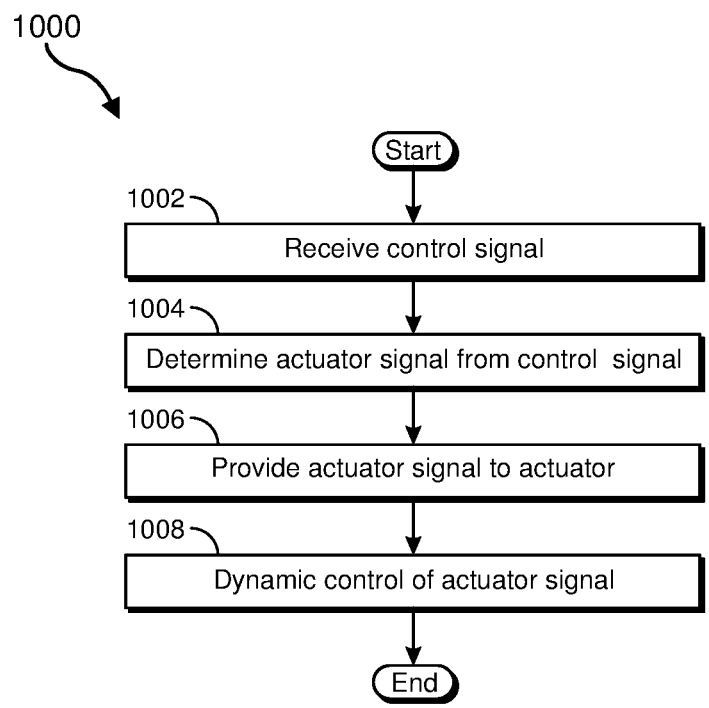
FIG. 10 is a flow diagram of an exemplary method for electrostatic actuation.

FIG. 10 is a flow diagram of an exemplary computer-implemented method 1000 for electrostatic actuation. The steps shown in FIG. 10 may be performed by any suitable computer-executable code and/or computing system, including the system illustrated in FIG. 8. In some examples, each of the steps shown in FIG. 10 may represent or otherwise be performed by an algorithm. In FIG. 10, step 1002 corresponds to receiving a control signal, for example, from a logic unit. The control signal may relate to desired application of haptic feedback to a person, for example, in embodiments where the actuator may be part of a wearable device. The control signal may be generated by, or otherwise based on the output of, an AR or VR system. Step 1004 corresponds to determining the actuator signal to be applied to the actuator, based on the control signal. The actuator signal may correspond to providing one or more electrical potentials to one or more electrical contacts of an actuator, for example, as described herein. Step 1006 corresponds to providing the actuator signal to the actuator. Step 1008 corresponds to time-modulation of the actuator signals, to provide a further haptic sensation to the person, for example, based on the control signal.

Figure 11:
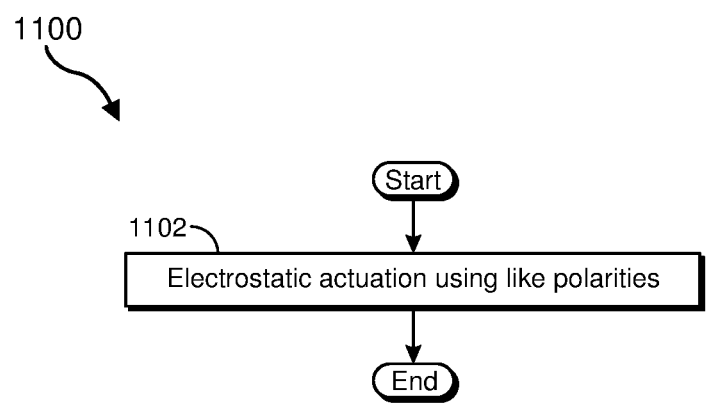
FIG. 11 is a flow diagram of an exemplary method for electrostatic actuation.

FIG. 11 shows a flow diagram illustrating an example method 1100 of operating an electrostatic device, in accordance with some embodiments of the disclosure. The steps shown in FIG. 11 may be performed by any suitable computer-executable code and/or computing system, including the system illustrated in FIG. 8. In accordance with various embodiments described herein, at step 1102, one or more systems described herein may induce electrostatic actuation of an electrostatic device using like polarities in accordance with any of the embodiments described herein (see, e.g., FIGS. 1A-8). For example, control element 822 of FIG. 8 may cause a first electrical potential to be applied to a first electrode of an electrostatic device. During application of the first electrical potential to the first electrode, control element 822 may cause a second electrical potential to be applied to a second electrode of the electrostatic device (see, e.g., FIGS. 1B, 2B, 6, and 7B). A polymer element may be disposed between the first electrode and the second electrode (see, e.g., FIGS. 1A-7B). In some embodiments, the first electrical potential may have the same polarity as the second electrical potential, thereby inducing a repulsive electrostatic force between the first electrode and the second electrode, and increasing a separation distance between the first electrode and the second electrode.

According to at least one embodiment, the method may further include subsequently applying electrical potentials having opposite polarities to the first electrode and the second electrode respectively, thereby inducing an attractive force between the first electrode and the second electrode. In some examples, the polymer element may include an electroactive polymer, and the attractive force may result, at least in part, from an electrically induced compression of the polymer element.

A computer-readable medium may include one or more computer-executable instructions that, when executed by at least one processor of a computing device, may cause the computing device to control the provision of actuator signals to an actuator. In some embodiments, a non-transitory computer-readable medium including one or more computer-executable instructions that, when executed by at least one processor of a computing device, cause the computing device to receive a control signal, for example, from a logic unit. The control signal may relate to desired application of haptic feedback to a person, for example, in various embodiments where the actuator may be part of a wearable device such as a glove, belt, glasses, other headwear, footwear, or other wearable device. The control signal may be generated by, or otherwise based on the output of, an AR or VR system, or other process generated by the computing device. The computing device may then determine the actuator signal to be applied to the actuator based on the control signal. The actuator signal may correspond to providing one or more electrical potentials to one or more electrical contacts of an actuator, for example, as described herein. The computing device then sends instructions, e.g., to a control element, to apply the actuator signal to the actuator, for example, through one or more electrical contacts. The computing device may then control the time-modulation of the actuator signal to provide a further desired haptic sensation to the person, for example, based on the control signal. In some embodiments, a system for actuation may include several modules stored in a memory of the computing device, for example, as part of a control element, logic unit, or other processor-based device. In some embodiments, a transducer, such as an electrostatic actuator, includes a first electrode, a second electrode, a polymer element disposed between the first electrode and the second electrode, and a control circuit configured to apply a first electrical potential to the first electrode and a second electrical potential to the second electrode. The first electrode and the second electrode may be separated by a separation distance, for example, when no electrical potential us applied to either electrode. The separation distance may be increased by an electrostatic repulsion between the first electrode and the second electrode when the first electrical potential is applied to the first electrode and the second electrical potential is applied to the second electrode. The first electrical potential and the second electrical potential may have the same polarity. For example, both the first and second electrical potentials may both have positive polarity, or may both have negative polarity. The first electrical potential and the second electrical potential may be substantially identical. The first electrode and the second electrode may be electrically interconnected, and the control circuit configured to apply a common electrical potential to both the first electrode and the second electrode.

In some embodiments, a polymer element may include an electroactive polymer and/or a dielectric polymer, and may be an electroactive element. A polymer element may include non-polymeric elements, such as voids, dielectric particles, plasticizers, monomer components, or other component. In some embodiments, the polymer element may be generally homogeneous. In some embodiments, the polymer element may include a plurality of nanovoids. The plurality of nanovoids may be generally uniformly distributed within the polymer element. In some embodiments, the device may provide a non-uniform mechanical response to application of the first electrical potential to the first electrode and the second electrical potential to the second electrode, based on a non-uniform distribution of voids within the polymer element. The first electrode may be disposed on a first substrate and the second electrode may be disposed a second substrate. The first and/or second substrate may include a flexible polymer film. The device may be a component of a wearable device, such as a glove or a head-mounted device. The device may be positioned adjacent to a second device, such as an electroactive device or electrostatic repulsion-based device, the devices cooperatively providing a cumulative displacement when both devices are actuated.

In some embodiments, a transducer may include a first device including a first pair of electrodes, a second device including a second pair of electrodes, and a control circuit configured to apply a first electrical potential to each electrode of the first pair of electrodes and a second electrical potential between the second pair of electrodes, wherein: a first distance between the first pair of electrodes is increased by electrostatic repulsion when the first electrical potential is applied to each electrode of the first pair of electrodes, and a second distance between the second pair of electrodes is increased and/or decreased when the second electrical potential is applied between the second pair of electrodes. The device may include a polymer element located between the second pair of electrodes, which may be an electroactive element. The device may include a polymer element located between the first pair of electrodes, which may be an electroactive element or a non-electroactive dielectric element. The first pair of electrodes may include a first electrode and a second electrode, with the first electrode disposed on a first substrate, the second electrode disposed on a second substrate, and where the first substrate and the second substrate each include a flexible polymer.

In some embodiments, a method (such as a method of electrical actuation) includes applying a first electrical potential to a first electrode, and applying, during application of the first electrical potential to the first electrode, a second electrical potential to a second electrode, wherein the first electrical potential has the same polarity as the second electrical potential, thereby inducing a repulsive electrostatic force between the first electrode and the second electrode, and thereby increasing a separation distance between the first electrode and the second electrode. In some embodiments, there may be a polymer element disposed between the first electrode and the second electrode. A method may further include subsequently applying electrical potentials having opposite polarities to the first electrode and the second electrode respectively, thereby inducing an attractive force between the first electrode and the second electrode. The polymer element may include an electroactive polymer, and the attractive force may result, at least in part, from an electrically induced compression of the polymer element.

In some embodiments, a device, such as a transducer (e.g., an actuator), includes a pair of spaced-apart electrodes, and application of voltages with the same polarity to each electrode induces an electrostatic repulsion between the electrodes. The two electrodes may be electrically interconnected (e.g., to a common electrode) so that the same electrical potential, which may be a positive or negative electrical potential, is applied both electrodes. The electrostatic repulsion may induce an appreciable increase in electrode separation, and consequent displacement of substrates mechanically associated with the electrodes. A polymer element (including, e.g., a dielectric polymer and/or an electroactive polymer) may be located between the electrodes. The polymer element may be nanovoided, using either an open-cell or a closed-cell configuration. Nanovoids may be patterned to achieve a spatially-varying transducer response. The polymer layer may have either a positive or negative Poisson's ratio. Applying voltages of the same polarity prevents the problem of electrostatic pull-in. A plurality of such devices may be stacked to increase the electrically-induced displacement. For example, a device may be stacked on top of another similar device. Adjacent devices may be separated by an insulating layer. Devices configured to operate using electrostatic repulsion may be combined with one or more devices using electrically-induced compression (e.g., electroactive devices including an electroactive polymer element using a potential difference). For example, an outwards convex curvature of an expanding device, driven by electrostatic repulsion, may be mechanically coupled to a complementary inwards concave curvature of a device using electrically-induced compression of an EAP element.

Devices described and shown herein may be utilized in any suitable technologies, without limitation. For example, such devices may be utilized as mechanical actuators to actuate movement of adjacent components. In at least one embodiment, the disclosed devices may be incorporated into optical systems such as adjustable lenses (e.g., fluid-filled lenses) as described herein to actuate movement of one or more optical layers. Such actuation may, for example, allow for selected movement of lens layers of an adjustable lens, resulting in deformation of the lens layers to adjust optical characteristics (e.g., focal point, spherical correction, cylindrical correction, axial correction, etc.) of the adjustable lens. In some embodiments, devices as disclosed herein may be utilized as actuators in micromechanical apparatuses, such as microelectromechanical devices. Additionally or alternatively, devices may be used for converting mechanical energy to electrical energy for use in energy harvesting systems and/or sensor apparatuses.

Electroactive Elements

In some embodiments, an electrostatic actuator, as described herein, may also function as, or operate cooperatively with, an electroactive element. The electroactive elements may include an elastomer having an effective Poisson's ratio of less than approximately 0.35 and an effective uncompressed density that is less than approximately 90% of the elastomer when densified. In some embodiments, the term "effective Poisson's ratio" may refer to the negative of the ratio of transverse strain (e.g., strain in a first direction) to axial strain (e.g., strain in a second direction) in a material. In some embodiments, the electroactive elements may include a nanovoided polymer material.

In the presence of an electrostatic field, an electroactive polymer may deform (e.g., compress, elongates, bend, etc.) according to the strength of that field. Generation of such a field may be accomplished, for example, by placing the electroactive polymer between two electrodes, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

In some embodiments, a polymer element may include an elastomer. As used herein, an "elastomer" may refer to a material, such as a polymer, with viscoelasticity (i.e., both viscosity and elasticity), relatively weak intermolecular forces, and generally low elastic modulus (a measure of the stiffness of a solid material) and high failure strain compared with other materials. In some embodiments, an electroactive polymer may include an elastomer material that has an effective Poisson's ratio of less than approximately 0.35 (e.g., less than approximately 0.3, less than approximately 0.25, less than approximately 0.2, less than approximately 0.15, less than approximately 0.1, less than approximately 0.5). In at least one example, the elastomer material may have an effective density that is less than approximately 90% (e.g., less than approximately 80%, less than approximately 70%, less than approximately 60%, less than approximately 50%, less than approximately 40%) of the elastomer when densified (e.g., when the elastomer is compressed, for example, by electrodes to make the elastomer more dense).

In some embodiments, an electroactive element may include an elastomer material, which may have a Poisson's ratio of approximately 0.35 or less. In some embodiments, an electroactive element may have a thickness of approximately 10 nm to approximately 10 μm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 μm, approximately 2 μm, approximately 3 μm, approximately 4 μm, approximately 5 μm, approximately 6 μm, approximately 7 μm, approximately 8 μm, approximately 9 μm, approximately 10 μm), with an example thickness of approximately 200 nm to approximately 500 nm.

A device may include a plurality of stacked layers, for example, each layer including an electroactive or electrostatic element disposed between a pair of electrodes. In some embodiments, an electrode may be shared between layers, for example, a device may have alternating electrodes and electroactive elements located between neighboring pairs of electrodes. Various stacked configurations can be constructed in different geometries that alter the shape, alignment, and spacing between layers. Such complex arrangements can enable compression, extension, twisting, and/or bending when operating the device.

Electroactive Polymers

An electroactive element may include one or more electroactive polymers, and may also include additional components. As used herein, "electroactive polymers" may refer to polymers that exhibit a change in size or shape when stimulated by an electric field. Some electroactive polymers may find limited applications due to a low breakdown voltage of the polymers with respect to the operating voltage used by devices (e.g., actuators) that use the polymers. Devices with reduced operating voltages and higher energy densities may be useful for many applications.

In some embodiments, an electroactive polymer may include a deformable polymer that may be symmetric with regard to electrical charge (e.g., polydimethylsiloxane (PDMS), acrylates, etc.) or asymmetric (e.g., poled polyvinylidene fluoride (PVDF) or its copolymers such as poly (vinylidenefluoride-co-trifluoroethylene) (PVDF-TrFE)). Additional examples of polymer materials forming electroactive polymer materials may include, without limitation, styrenes, polyesters, polycarbonates, epoxies, halogenated polymers, such as PVDF, copolymers of PVDF, such as PVDF-TrFE, silicone polymers, and/or any other suitable polymer materials. Such materials may have any suitable dielectric constant or relative permittivity, such as, for example, a dielectric constant ranging from approximately 2 to approximately 30.

The physical origin of the compressive nature of electroactive polymers in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance in this case is the change of strain with respect to stress or, equivalently, in more practical terms, the change in displacement with respect to force.

Voids

In some embodiments, an electroactive element may include voids, such as nanovoids (e.g., having a plurality of voids and/or nanoscale-sized voids in an electroactive element including an electroactive polymer or composite thereof). In some embodiments, the nanovoids may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the electroactive elements. The voids and/or nanovoids may be either closed- or open-celled, or a mixture thereof. If they are open-celled, the void size may be the minimum average diameter of the cell. In some embodiments, the polymer layer may include a thermoset material and/or any other suitable material having an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, approximately 9 GPa).

The voids and/or nanovoids may be any suitable size and, in some embodiments, the voids may approach the scale of the thickness of the polymer layer in the undeformed state. For example, the voids may be between approximately 10 nm to about equal to the gap between the paired two electrodes. In some embodiments, the voids may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, approximately 1000 nm).

In some embodiments, the term "effective density," as used herein, may refer to a parameter that may be obtained using a test method where a uniformly thick layer of the elastomer may be placed between two flat and rigid circular plates. In some embodiments, the diameter of the elastomer material being compressed may be at least 100 times the thickness of the elastomer material. The diameter of the elastomer material may be measured, then the plates may be pressed together to exert a pressure of at least approximately $1 \times 10^6$ Pa on the elastomer, and the diameter of the elastomer is remeasured. The effective density may be determined from the following expression: $D_{ratio} = D_{uncompressed} / D_{compressed}$, where $D_{ratio}$ may represent the effective density ratio, $D_{uncompressed}$ may represent the density of the uncompressed polymer, and $D_{compressed}$ may represent the density of the uncompressed polymer.

The density of voids within an electroactive element, or other dielectric material, may vary as a function of position. In some embodiments, the volume fraction of an electroactive component (or dielectric material) may vary between 10% and 60%. The structure of the voids may be interconnected (open cell) or the voids may be fully enclosed by suitable dielectric material (closed cell). The voids may be partially filled with a dielectric liquid or dielectric gas. The voids may be partially coated with a layer of suitable material. In some embodiments, a voided material (such as a porous material) may be fabricated using a templating agent, for example, a material that directs the structural formation of pores or other structural elements of an electroactive element. A templating agent may be any phase of matter (solid, liquid, gas). In some embodiments, a templating agent is removed to produce a pore (or void).

Particles

In some embodiments, an electroactive element may include particles including a material having a high dielectric constant, the particles having an average diameter between approximately 10 nm and approximately 1000 nm. In some embodiments, the material having the high dielectric constant may include barium titanate In some embodiments, an electroactive element may include one or more polymers, and may additionally include a plurality of particles. In some embodiments, an electroactive element may include particles of a material to assist the formation of voids, support voided regions, or both. Example particle materials include: a silicate, such as silica, including structures resulting from silica gels, fumed silica; a titanate, such as barium titanate; a metal oxide, such as a transition metal oxide, such as titanium dioxide; another oxide; composites or combinations thereof; or other particle material. The particles may have an average diameter between approximately 10 nm and approximately 1000 nm, and the particles may form branched or networked particles with average dimensions of between approximately 100 and approximately 10,000 nm.

In some embodiments, an electroactive element may include particles of a material having a high dielectric constant. In some embodiments, the particles may have an average diameter between approximately 10 nm and approximately 1000 nm. In some embodiments, the particle material may have a high dielectric constant. In some embodiments, the particle material may include a titanate, such as barium titanate ($BaTiO_3$), or other perovskite material such as other titanates.

Additionally or alternatively, any other suitable component may be added to the electroactive polymer material. $BaTiO_3$ is a ferroelectric material with a relatively high dielectric constant (e.g., a value of between approximately 500 and approximately 7000) and polarization and may be used in various devices described herein. Besides large polarizability and permittivity, large strains may also be achievable with $BaTiO_3$. Pure $BaTiO_3$ is an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the first electroactive element or the second electroactive element.

In some embodiments, a device includes a first electrode, a second electrode and a voided polymer layer interposed between at least a portion of the area of the first and second electrode. In some embodiments, the voided polymer layer has no periodic structure on length scales greater than 10 nm and the voids have a characteristic length scale that is less than 1 micron. Voids may form a connected structure in an open cell configuration, or the voids may be surrounded, e.g., by dielectric material in a closed cell configuration. In some embodiments, a voided dielectric material may further include particles of a material with a high dielectric constant, such as a solid such as barium titanite. In some embodiments, voids may be filled with a fluid, such as a liquid or a gas, for example, a dielectric liquid or a dielectric gas with high dielectric strength gas, such as a halide, in particular, a fluoride such as is sulfur hexafluoride, organofluoride or the like.

Electrodes

In some embodiments, an "electrode," as used herein, may refer to a conductive material, which may be in the form of a film or a layer. The electrode may be self-healing, such that when an area of an active layer (e.g., an electroactive element) shorts out, the electrode may be able to isolate the damaged area.

In some embodiments, the electrodes (e.g., such as a first electrode, a second electrode 115, or any other electrode) may include a metal such as aluminum, gold, silver, tin, copper, indium, gallium, zinc, and the like. An electrode may include one or more electrically conductive material, such as a metal, a semiconductor (such as a doped semiconductor), carbon nanotube, graphene, transparent conductive oxides (TCOs, e.g., indium tin oxide (ITO), zinc oxide (ZnO), etc.), or other electrically conducting material.

In some embodiments, devices may include paired electrodes, which allow the creation of the electrostatic field that forces constriction of the electroactive polymer. Such electrodes may include relatively thin, electrically conductive layers or elements and may be of a non-compliant or compliant nature. Any suitable materials may be utilized in the electrodes, including electrically conductive materials suitable for use in thin-film electrodes, such as, for example, aluminum, transparent conductive oxides, silver, indium, gallium, zinc, carbon nanotubes, carbon black, and/or any other suitable materials formed by vacuum deposition, spray, adhesion, and/or any other suitable technique either on a non-electroactive polymer layer or directly on the electroactive polymer surface itself. In some embodiments, the electrode or electrode layer may be self-healing, such that damage from local shorting of a circuit can be isolated. Suitable self-healing electrodes may include thin films of metals, such as, for example, aluminum.

In some embodiments, one or more electrodes may be optionally electrically interconnected, e.g., through a contact layer, to a common electrode. In some embodiments, a device may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer. In some embodiments, an electrode (or other electrical connector) may include a metal (e.g., tin, aluminum, copper, gold, silver, and the like). In some embodiments, an electrode (such as an electrical contact) or an electrical connector may include a similar material to other similar components.

In some embodiments, a first electrode may overlap (e.g., overlap in a parallel direction) at least a portion of a second electrode. The first and second electrode may be generally parallel and spaced apart. A third electrode may overlap at least a portion of either the first or second electrode. An electroactive element may include a first polymer (e.g., an elastomer material) and may be disposed between a first pair of electrodes (e.g., the first electrode and the second electrode). A second electroactive element, if used, may include a second elastomer material and may be disposed between second a pair of electrodes. In some embodiments, there may be an electrode that is common to both the first pair of electrodes and the second pair of electrodes.

In some embodiments, a common electrode may be electrically coupled (e.g., electrically contacted at an interface having a low contact resistance) to one or more other electrode(s), e.g., a second electrode and a third electrode located either side of a first electrode. In some embodiments, a device may include additional electroactive elements interleaved between electrodes, for example, in a stacked configuration. For example, electrodes may form an interdigitated stack of electrodes, with alternate electrodes connected to a first common electrode and the remaining alternate electrodes connected to a second common electrode. For example, an additional electroactive element may be disposed on the other side of a first electrode. The additional electroactive element may overlap a first electroactive element. An additional electrode may be disposed abutting a surface of any additional electroactive element. In some embodiments, a device may include more (e.g., two, three, or more) such additional electroactive elements and corresponding electrodes. For example, a device may include a stack of two or more electroactive elements and corresponding electrodes, along with one or more electrostatic actuators. For example, a device may include between 2 electroactive elements and/or electrostatic actuators to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive elements or electrostatic actuators.

In some embodiments, electrodes may be flexible and/or resilient and may stretch, for example, elastically, when an electroactive element undergoes deformation. Electrodes may include one or more transparent conducting oxides (TCOs) such as indium oxide, tin oxide, indium tin oxide (ITO) and the like, graphene, carbon nanotubes, and the like. In other embodiments, for example, embodiments where devices have electroactive and/or electrostatic elements optionally including nanovoided electroactive polymer materials, relatively rigid electrodes (e.g., electrodes including a metal such as aluminum) may be used.

In some embodiments, an electrode (e.g., the first and/or second electrode, or any other electrode) may have an electrode thickness of approximately 1 nm to approximately 100 nm, with an example thickness of approximately 10 nm to approximately 50 nm. In some embodiments, an electrode may be designed to allow healing of electrical breakdown (e.g., the electric breakdown of elastomeric polymer materials) of an electroactive element. In some embodiments, an electrode may have an electrode thickness of approximately 20 nm. In some embodiments, a common electrode may have a sloped shape, or may be a more complex shape (e.g., patterned or freeform). In some embodiments, a common electrode may be shaped to allow compression and expansion of a device during operation.

Electrode Fabrication

In some embodiments, an electrode (e.g., the first electrode, the second electrode, or any other electrode including any common electrode) may be fabricated using any suitable process. For example, electrodes may be fabricated using physical vapor deposition (PVD), chemical vapor deposition (CVD), sputtering, spray-coating, spin-coating, atomic layer deposition (ALD), and the like. In some embodiments, an electrode may be manufactured using a thermal evaporator, a sputtering system, a spray coater, a spin-coater, an ALD unit, and the like. In some embodiments, an electroactive element may be deposited directly on to an electrode. In some embodiments, an electrode may be deposited directly on to the electroactive element. In some embodiments, electrodes may be prefabricated and attached to an electroactive element. In some embodiments, an electrode may be deposited on a substrate, for example, a glass substrate or flexible polymer film. In some embodiments, an electroactive element may directly abut an electrode. In some embodiments, there may be a dielectric layer, such as an insulating layer, between an electroactive element and an electrode. Any suitable combination of processes may be used.

Lens Assemblies and Optical Systems

In some embodiments, a device may include or be mechanically coupled to one or more optical elements. An optical element may include a lens, mirror, prism, holographic element, beam splitter, optical filter, diffraction grating, or other optical element. In some embodiments, a device, such as an actuator, may include or be mechanically coupled to an adjustable lens. An adjustable lens may include any suitable type of lens with adjustable optical properties (e.g., adjustable optical power/focal length, correcting for wave-front distortion and/or aberrations, etc.), a liquid lens, a gel lens, or other adjustable lens. For example, an adjustable lens may include a deformable exterior layer filled with an optical medium such as a liquid or a semi-solid material (e.g., a gel, a semi-solid polymer, etc.). An adjustable lens may include one or more substantially transparent materials (at wavelengths of application) that may deform and/or flow under pressure.

A deformable optical element may include a substantially transparent and elastic material. For example, a deformable optical element may include a natural or synthetic elastomer that returns to a resting state when a deforming force is removed. In some embodiments, a deformable optical element may be deformed using a device generating a directly-driven force to produce a desired optical power or other optical property, e.g., for a lens or other optical element. In some embodiments, actuation forces may be applied around a perimeter of a deformable lens, and may be generally uniform or variable around the perimeter of a lens. In some embodiments, devices may be used to actuate deformable optical elements in optical assemblies (e.g., lens systems).

In some embodiments, an actuator may include a bender. In some embodiments, the term "bender," as used herein, may refer, without limitation, to an electrically-driven actuator based on a plate or beam design that converts in-plane contraction, via an applied electric field, into out-of-plane displacement. A bender or bending actuator may include an all-electroactive or composite material stack operated in a bimorph, unimorph, or multilayered monolith configuration. In some embodiments, the term "unimorph bender," as used herein, may refer, without limitation, to a beam or plate having an electroactive layer and an inactive layer, in which displacement results from contraction or expansion of the electroactive layer. In some embodiments, the term "bimorph bender," as used herein, may refer, without limitation, to a beam or plate having two electroactive layers, in which displacement results from expansion or contraction of one layer with alternate contraction or expansion of the second layer.

In some embodiments, the term "multilayer bender," as used herein, may refer, without limitation, to a multilayer stack of electroactive, electrode, and insulation layers integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some embodiments, a control system for a multilayer bender may not require a high voltage power supply.

According to some embodiments, an actuator may be a frame-contoured ring bender and/or may include stacked or overlapping benders. Furthermore, actuator volume may be constrained to an edge region outside an optical aperture, which may include a perimeter volume of a lens, an optical element, an optical sub-assembly, etc. As noted, device(s) such as an actuator (or a set of actuators) may provide equal or varied force and displacement at discrete points or along a spatially-defined distribution at the perimeter of a lens.

In some embodiments, a device may include one or more direct-drive benders, that may include an electroactive element that is disposed between two electrodes. In such examples, methods of forming a device may involve forming electrodes and an electroactive polymer simultaneously (e.g., via coflowing, slot die coating, etc.).

In some embodiments, a lens assembly may include multiple deformable optical elements (e.g., multiple deformable lenses, such as liquid lenses), where the deformation is provided by one or more devices, in accordance with example embodiments of the disclosure.

Methods of Device Fabrication

Various fabrication methods are discussed below. Properties of the electroactive element may be varied across its spatial extent by varying one or more process parameters, such as wavelength, intensity, substrate temperature, other process temperature, gas pressure, application of additional radiation, chemical concentration gradients, chemical composition variations (e.g., to control micelle size), or other process parameter. Non-uniform void size distributions may be obtained by varying the size of sacrificial regions within an electroactive element.

Methods of forming an example device include forming electrodes and electroactive elements sequentially (e.g., via vapor deposition, coating, printing, etc.) or simultaneously (e.g., via co-flowing, coextrusion, slot die coating, etc.). Alternatively, the electroactive elements may be deposited using initiated chemical vapor deposition (iCVD), where, for example, suitable monomers of the desired polymers may be used to form the desired coating. In some embodiments, monomers, oligomers, and/or prepolymers for forming the electroactive elements may optionally be mixed with a solvent and the solvent may be removed from the electroactive element during and/or following curing to form nanovoids within the electroactive element.

A method of fabricating a device may include depositing a curable material onto a first electrode, curing the deposited curable material to form an electroactive element, e.g., including a cured elastomer material, and depositing an electrically conductive material onto a surface of the electroactive element opposite the primary electrode to form a second electrode. In some embodiments, the cured elastomer material may have a Poisson's ratio of approximately 0.35 or less. In some embodiments, a method may further include depositing an additional curable material onto a surface of the second electrode opposite the electroactive element, curing the deposited additional curable material to form a second electroactive element including a second cured elastomer material, and depositing an additional electrically conductive material onto a surface of the second electroactive element opposite the second electrode to form a third electrode.

In some embodiments, a method of fabricating an electroactive element may include vaporizing a curable material, or a precursor thereof, where depositing the curable material may include depositing the vaporized curable material onto the first electrode. In some embodiments, a method of fabricating an electroactive element may include printing the polymer or precursor thereof (such as a curable material) onto an electrode. In some embodiments, a method may also include combining a polymer precursor material with at least one other component to form a deposition mixture. In some embodiments, a method may include combining a curable material with particles of a material having a high dielectric constant to form a deposition mixture.

According to some embodiments, a method may include positioning a curable material between a first electrically conductive material and a second electrically conductive material. The positioned curable material may be cured to form an electroactive element including a cured elastomer material. In some embodiments, the cured elastomer material may have a Poisson's ratio of approximately 0.35 or less. In some embodiments, at least one of the first electrically conductive material or the second electrically conductive material may include a curable electrically conductive material, and the method may further include curing the at least one of the first electrically conductive material or the second electrically conductive material to form an electrode. In this example, curing the at least one of the first electrically conductive material or the second electrically conductive material may include curing the at least one of the first electrically conductive material or the second electrically conductive material during curing of the positioned curable material.

In some embodiments, a curable material and at least one of a first electrically conductive material or a second electrically conductive material may be flowable during positioning of the curable material between the first and second electrodes. A method of fabricating a device may further include flowing a curable material and at least one of the first electrically conductive material or the second electrically conductive material simultaneously onto a substrate.

In some embodiments, methods for fabricating a device (e.g., an electroactive and/or electrostatic actuator) may include masks (e.g., shadow masks) to control the patterns of deposited materials to form the device. In some embodiments, the device may be fabricated on a surface enclosed by a deposition chamber, which may be evacuated (e.g., using one or more mechanical vacuum pumps to a predetermined level such as $10^{-6}$ Torr or below). A deposition chamber may include a rigid material (e.g., steel, aluminum, brass, glass, acrylic, and the like). A surface used for deposition may include a rotating drum. In some embodiments, the rotation may generate centrifugal energy and cause the deposited material to spread more uniformly over any underlying sequentially deposited materials (e.g., electrodes, polymer elements, and the like) that are mechanically coupled to the surface. In some embodiments, the surface may be fixed and the deposition and curing systems may move relative to the surface, or both the surface, the deposition, and/or curing systems may be moving simultaneously.

In some embodiments, a device (e.g., an actuator, or the like) may be fabricated by: providing an electrically conductive layer (e.g., a first electrode) having a first surface; depositing (e.g., vapor depositing) a polymer (e.g., an electroactive polymer) or polymer precursor (such as a monomer) onto the electrode; as needed, forming a polymer such as an electroactive polymer from the polymer precursor (e.g., by curing or a similar process); and depositing another electrically conductive layer (e.g., a second electrode) onto the electroactive polymer. In some embodiments, the method may further include repeating one or more of the above to fabricate additional layers (e.g., second electroactive element, other electrodes, an alternating stack of polymer layers and electrodes, and the like). A device may have a stacked configuration.

In some embodiments, a device may be fabricated by first depositing a first electrode, and then depositing a curable material (e.g., a monomer) on the first electrode (e.g., deposited using a vapor deposition process). In some embodiments, an inlet (not shown) to a deposition chamber may open and may input an appropriate monomer initiator for starting a chemical reaction. In some embodiments, "monomer," as used herein, may refer to a monomer that forms a given polymer (i.e., as part of an electroactive element). In other examples, polymerization of a polymer precursor (such as a monomer) may include exposure to electromagnetic radiation (e.g., visible, UV, x-ray or gamma radiation), exposure to other radiation (e.g., electron beams, ultrasound), heat, exposure to a chemical species (such as a catalyst, initiator, and the like, some combination thereof, and the like.

Deposited curable material may be cured with a source of radiation (e.g., electromagnetic radiation, such as UV and/or visible light) to form an electroactive element that includes a cured elastomer material, for example, by photopolymerization. In some embodiments, a radiation source may include an energized array of filaments that may generate electromagnetic radiation, a semiconductor device such as light-emitting diode (LED) or semiconductor laser, other laser, fluorescence or an optical harmonic generation source, and the like. A monomer and an initiator (if used) may react upon exposure to radiation to form an electroactive element. In some embodiments, radiation may include radiation having an energy (e.g., intensity and/or photon energy) capable of breaking covalent bonds in a material. Radiation examples may include electrons, electron beams, ions (such as protons, nuclei, and ionized atoms), x-rays, gamma rays, ultraviolet visible light, or other radiation, e.g., having appropriately high energy levels. In some embodiments, the cured elastomer material may include at least one non-polymeric component in a plurality of defined regions and the method may further include removing at least a portion of the at least one non-polymeric component from the cured elastomer material to form a voided (e.g., nanovoided) polymer element.

An electrically conductive material then be deposited onto a surface of the first electroactive element opposite a first electrode to form a second electrode. An additional curable material may be deposited onto a surface of the second electrode opposite the electroactive element. For example, the deposited additional curable material may be cured to form a second electroactive element 110, for example, including a second cured elastomer material. In some embodiments, an additional electrically conductive material may be deposited onto a surface of the second electroactive element 110 opposite the second electrode 115 to form a third electrode.

In some embodiments, a deposition chamber may have an exhaust port configured to open to release at least a portion of the vapor in the chamber during and/or between one or more depositions of the materials (e.g., monomers, oligomers, monomer initiators, conductive materials, etc.). In some embodiments, a deposition chamber may be purged (e.g., with a gas or the application of a vacuum, or both), to remove a portion of the vapor (e.g., monomers, oligomers, monomer initiators, metal particles, and any resultant by-products). Thereafter one or more of the previous steps may be repeated (e.g., for a second electroactive element, and the like). In this way, individual layers of the device may be maintained at high purity levels.

In some embodiments, the deposition of the materials (e.g., monomers, oligomers, monomer initiators, conductive materials, etc.) of the device may be performed using a deposition process, such as chemical vapor deposition (CVD), to be described further below. CVD may refer to a vacuum deposition method used to produce high-quality, high-performance, solid materials. In CVD, a substrate may be exposed to one or more precursors, which may react and/or decompose on the substrate surface to produce the desired deposit (e.g., one or more electrodes, electroactive polymers, etc.). Frequently, volatile by-products are also produced, which may be removed by gas flow through the chamber.

In some embodiments, a device may be fabricated using an atmospheric pressure CVD (APCVD) coating formation technique (e.g., CVD at atmospheric pressure). In some embodiments, a device may be fabricated using a low-pressure CVD (LPCVD) process (e.g., CVD at sub-atmospheric pressures). In some embodiments, LPCVD may make use of reduced pressures that may reduce unwanted gas-phase reactions and improve the deposited material's uniformity across the substrate. In one aspect, the apparatus 300 may apply an ultrahigh vacuum CVD (UHVCVD) process (e.g., CVD at very low pressure, typically below approximately $10^{-6}$ Pa (equivalently, approximately $10^{-8}$ torr)).

In some embodiments, a device may be fabricated using an aerosol-assisted CVD (AACVD) process (e.g., a CVD in which the precursors are transported to the device) by means of a liquid/gas aerosol, which may be generated ultrasonically or with electrospray. In some embodiments, AACVD may be used with non-volatile precursors. In some embodiments, a device may be fabricated using a direct liquid injection CVD (DLICVD) process (e.g., a CVD in which the precursors are in liquid form, for example, a liquid or solid dissolved in a solvent). Liquid solutions may be injected in a deposition chamber towards one or more injectors. The precursor vapors may then be transported to the device as in CVD. DLICVD may be used on liquid or solid precursors, and high growth rates for the deposited materials may be reached using this technique.

In some embodiments, a device may be fabricated using a hot wall CVD process (e.g., CVD in which the deposition chamber is heated by an external power source and the device is heated by radiation from the heated wall of the deposition chamber). In another aspect, a device may be fabricated using a cold wall CVD process (e.g., a CVD in which only the device is directly heated, for example, by induction, while the walls of the chamber are maintained at room temperature).

In some embodiments, a device may be fabricated using a microwave plasma-assisted CVD (MPCVD) process, where microwaves are used to enhance chemical reaction rates of the precursors. In another aspect, a device may be fabricated using a plasma-enhanced CVD (PECVD) process (e.g., CVD that uses plasma to enhance chemical reaction rates of the precursors). In some embodiments, PECVD processing may allow deposition of materials at lower temperatures, which may be useful in withstanding damage to the device or in depositing certain materials (e.g., organic materials and/or some polymers).

In some embodiments, a device may be fabricated using a remote plasma-enhanced CVD (RPECVD) process. In some embodiments, RPECVD may be similar to PECVD except that the device may not be directly in the plasma discharge region. In some embodiments, the removal of the device from the plasma region may allow for the reduction of processing temperatures down to room temperature.

In some embodiments, a device may be fabricated using an atomic-layer CVD (ALCVD) process. In some embodiments, ALCVD may deposit successive layers of different substances to produce layered, crystalline film coatings on the device.

In some embodiments, a device may be fabricated using a combustion chemical vapor deposition (CCVD) process. In some embodiments, CCVD (also referred to as flame pyrolysis) may refer to an open-atmosphere, flame-based technique for depositing high-quality thin films (e.g., layers of material ranging from fractions of a nanometer (monolayer) to several micrometers in thickness) and nanomaterials, which may be used in forming the device.

In some embodiments, a device may be fabricated using a hot filament CVD (HFCVD) process, which may also be referred to as catalytic CVD (cat-CVD) or initiated CVD (iCVD). In some embodiments, this process may use a hot filament to chemically decompose the source gases to form the materials of the device. Moreover, the filament temperature and temperature of portions of the device may be independently controlled, allowing colder temperatures for better adsorption rates at the device, and higher temperatures necessary for decomposition of precursors to free radicals at the filament.

In some embodiments, a device may be fabricated using a hybrid physical-chemical vapor deposition (HPCVD) process. HPCVD may involve both chemical decomposition of precursor gas and vaporization of a solid source to form the materials on the device.

In some embodiments, a device may be fabricated using metalorganic chemical vapor deposition (MOCVD) process (e.g., a CVD that uses metalorganic precursors) to form materials on the device. For example, an electrode may be formed on an electroactive element using this approach.

In some embodiments, a device may be fabricated using a rapid thermal CVD (RTCVD) process. This CVD process uses heating lamps or other methods to rapidly heat the device. Heating only the device rather than the precursors or chamber walls may reduce unwanted gas-phase reactions that may lead to particle formation in the device.

In some embodiments, a device may be fabricated using a photo-initiated CVD (PICVD) process. This process may use UV light to stimulate chemical reactions in the precursor materials used to make the materials for the device. Under certain conditions, PICVD may be operated at or near atmospheric pressure.

In some embodiments, devices may be fabricated by nanovoided a process including depositing a curable material (e.g., a monomer such as an acrylate or a silicone) and a solvent for the curable material onto a substrate, heating the curable material with at least a portion of the solvent remaining with the cured monomer, and removing the solvent from the cured monomer. Using this process, voids such as nanovoids may be formed in the electroactive element. In some embodiments, a flowable material (e.g., a solvent) may be combined with the curable materials (e.g., monomers and conductive materials) to create a flowable mixture that may be used for producing electroactive polymers with nanovoids. The monomers may be monofunctional or polyfunctional, or mixtures thereof. Polyfunctional monomers may be used as crosslinking agents to add rigidity or to form elastomers. Polyfunctional monomers may include difunctional materials such as bisphenol fluorene (EO) diacrylate, trifunctional materials such as trimethylolpropane triacrylate (TMPTA), and/or higher functional materials. Other types of monomers may be used, including, for example, isocyanates, and these may be mixed with monomers with different curing mechanisms.

In some embodiments, the flowable material may be combined (e.g., mixed) with a curable material (e.g., a monomer). In some embodiments, a curable material may be combined with at least one non-curable component (e.g., particles of a material having a high dielectric constant) to form a mixture including the curable material and the at least one non-curable component, for example, on an electrode (e.g., a first electrode or a second electrode) of the device. Alternatively, the flowable material (e.g., solvent) may be introduced into a vaporizer to deposit (e.g., via vaporization or, in alternative embodiments, via printing) a curable material onto an electrode. In some embodiments, a flowable material (e.g., solvent) may be deposited as a separate layer either on top or below a curable material (e.g., a monomer) and the solvent and curable material may be allowed to diffuse into each other before being cured by the source of radiation to generate an electroactive polymer having nanovoids. In some embodiments, after the curable material is cured, the solvent may be allowed to evaporate before another electroactive polymer or another electrode is formed. In some embodiments, the evaporation of the solvent may be accelerated by the application of heat to the surface with a heater, which may, for example, be disposed within a drum forming surface and/or any other suitable location, or by reducing the pressure of the solvent above the substrate using a cold trap (e.g., a device that condenses vapors into a liquid or solid), or a combination thereof. Isolators (not shown) may be added to the apparatus to prevent, for example, the solvent vapor from interfering with the radiation source or the electrode source.

In some embodiments, the solvent may have a vapor pressure that is similar to at least one of the monomers being evaporated. The solvent may dissolve both the monomer and the generated electroactive polymer, or the solvent may dissolve only the monomer. Alternatively, the solvent may have low solubility for the monomer, or plurality of monomers if there is a mixture of monomers being applied. Furthermore, the solvent may be immiscible with at least one of the monomers, and may at least partially phase separate when condensed on the substrate.

In some embodiments, there may be multiple vaporizers, with each of the multiple vaporizers applying a different material, including solvents, non-solvents, monomers, and/or ceramic precursors such as tetraethyl orthosilicate and water, and optionally a catalyst for forming a sol-gel such as HCl or ammonia.

In some embodiments, a method of generating a nanovoided polymer for use in connection with a device (such as electroactive and/or electrostatic devices described variously herein) may include co-depositing a monomer or mixture of monomers, a surfactant, and a nonsolvent material associated with the monomer(s) which is compatible with the surfactant. In various examples, the monomer(s) may include, but not be limited to, ethyl acrylate, butyl acrylate, octyl acrylate, ethoxy ethyl acrylate, 2-chloroethyl vinyl ether, chloromethyl acrylate, methacrylic acid, allyl glycidyl ether, and/or N-methylol acrylamide. Other curing agents such as polyamines, higher fatty acids or their esters, and/or sulfur may be used as the monomer(s). In some aspects, the surfactant may be ionic or non-ionic (e.g., SPAN 80, available from Sigma-Aldrich Company). In another aspect, the non-solvent material may include organic and/or inorganic non-solvent materials. For instance, the non-solvent material may include water or a hydrocarbon or may include a highly polar organic compound such as ethylene glycol. As noted, the monomer or monomers, non-solvent, and surfactant may be co-deposited. Alternatively, the monomer or monomers, non-solvent, and/or surfactant may be deposited sequentially. In one aspect, a substrate temperature may be controlled to generate and control one or more properties of the resulting emulsion generated by co-depositing or sequentially depositing the monomer or monomers, non-solvent, and surfactant. The substrate may be treated to prevent destabilization of the emulsion. For example, an aluminum layer may be coated with a thin polymer layer made by depositing a monomer followed by curing the monomer.

As discussed throughout the instant disclosure, the disclosed devices, systems, and methods may provide one or more advantages over conventional devices, systems, and methods. For example, in contrast to prior devices, devices presented herein may include electroactive elements and/or electrostatic elements that achieve substantially uniform strain in the presence of an electrostatic field produced by a potential difference between paired electrodes, permitting the devices to achieve, for example, improvements in both energy density and specific power density. Such uniform strain may reduce or eliminate unwanted deformations in the electroactive elements and may result in greater overall deformation, such as compression, of the electroactive elements, providing a greater degree of movement of surface regions of the electroactive elements while requiring a lower amount of energy to provide such deformation. The electroactive elements may include polymer materials having nanovoided regions that allow for additional compression in the presence of a voltage gradient in comparison to non-voided materials. Additionally, a device may be formed in a stacked structure having a plurality of electroactive elements and/or electrostatic elements that are layered with multiple electrodes, enabling the plurality of electroactive and/or electrostatic elements to be actuated in conjunction with each other in a single device that may undergo a more substantial degree of deformation (e.g., compression and/or expansion) in comparison to a device having a single electroactive and/or electrostatic element or layer.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive [data] to be transformed, transform the [data], output a result of the transformation to [perform a function], use the result of the transformation to [perform a function], and store the result of the transformation to [perform a function]. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device comprising:
   a first electrode;
   a second electrode;
   a polymer element disposed between the first electrode and the second electrode; and a control circuit configured to apply a first electrical potential to the first electrode and a second electrical potential to the second electrode, wherein:
the first electrical potential and the second electrical potential have the same polarity;
the first electrode and the second electrode are separated by a separation distance;
the separation distance is increased by an electrostatic repulsion between the first electrode and the second electrode when the first electrical potential is applied to the first electrode and the second electrical potential is applied to the second electrode;
the device provides a non-uniform mechanical response to application of the first electrical potential to the first electrode and the second electrical potential to the second electrode; and
the non-uniform mechanical response arises from a non-uniform volume fraction of voids within the polymer element, there being a greater mechanical response in a portion of the polymer element having a higher volume fraction of voids.

2. The device of claim 1, wherein the first electrical potential and the second electrical potential are substantially identical.

3. The device of claim 1, wherein:
the first electrode and the second electrode are electrically interconnected, and
the control circuit is configured to apply a common electrical potential to both the first electrode and the second electrode.

4. The device of claim 1, wherein the polymer element comprises an electroactive polymer.

5. The device of claim 1, wherein the polymer element includes a plurality of nanovoids.

6. The device of claim 1, wherein the first electrode is disposed on a first substrate and the second electrode is disposed a second substrate.

7. The device of claim 6, wherein the first substrate comprises a flexible polymer film.

8. The device of claim 1, wherein the device is a component of a wearable device.

9. The device of claim 8, wherein the wearable device is a glove or a head-mounted device.

10. The device of claim 1, wherein the device is positioned adjacent to an electroactive device, wherein the device and the electroactive device cooperatively provide a cumulative displacement when both the device and the electroactive device are actuated.

11. A device comprising:
a first device comprising a first pair of electrodes;
a second device comprising a second pair of electrodes; and
a control circuit configured to apply a first electrical potential to each electrode of the first pair of electrodes and a second electrical potential between the second pair of electrodes,
wherein:
a first distance between the first pair of electrodes is increased by electrostatic repulsion when the first electrical potential is applied to each electrode of the first pair of electrodes;
a second distance between the second pair of electrodes is decreased when the second electrical potential is applied between the second pair of electrodes;
the first device comprises a polymer element located between the first pair of electrodes;
the first device provides a non-uniform mechanical response to application of the first electrical potential to each electrode of the first pair of electrodes; and
the non-uniform mechanical response arises from a non-uniform volume fraction of voids within the polymer element with a greater mechanical response in a portion of the polymer element having a higher volume fraction of voids.

12. The device of claim 11, wherein the polymer element is an electroactive polymer element located between the first pair of electrodes.

13. The device of claim 11, further comprising an electroactive polymer element located between the second pair of electrodes.

14. The device of claim 11, wherein:
the first pair of electrodes comprises a first electrode and a second electrode,
the first electrode is disposed on a first substrate,
the second electrode is disposed on a second substrate, and
the first substrate and the second substrate each comprise a flexible polymer.

15. A method of electrical actuation, comprising:
applying a first electrical potential to a first electrode; and
applying, during application of the first electrical potential to the first electrode, a second electrical potential to a second electrode,
wherein:
the first electrical potential has the same polarity as the second electrical potential, thereby inducing a repulsive electrostatic force between the first electrode and the second electrode, and increasing a separation distance between the first electrode and the second electrode, and
a polymer element is disposed between the first electrode and the second electrode,
wherein:
the electrical actuation is a non-uniform actuation, the non-uniform actuation at least in part arising from a non-uniform volume fraction of voids within the polymer element; and
there is a greater electrical actuation in a portion of the polymer element having a higher volume fraction of voids.

16. The method of claim 15, further comprising subsequently applying electrical potentials having opposite polarities to the first electrode and the second electrode respectively, thereby inducing an attractive force between the first electrode and the second electrode.

17. The method of claim 16, wherein the polymer element comprises an electroactive polymer, and the attractive force results, at least in part, from an electrically induced compression of the polymer element.

* * * * *

UNITED STATES PATENT AND TRADEMARK OFFICE
CERTIFICATE OF CORRECTION

PATENT NO. : 11,139,756 B2  
APPLICATION NO. : 16/215684  
DATED : October 5, 2021  
INVENTOR(S) : Menguc et al.

Page 1 of 1

It is certified that error appears in the above-identified patent and that said Letters Patent is hereby corrected as shown below:

On the Title Page

In Column 1, item (12), Line 2, delete "Mengue" and insert -- Menguc --, therefor.

In Column 1, item (72), Inventors, Line 1, delete "Mengue," and insert -- Menguc, --, therefor.

Signed and Sealed this  
Twenty-ninth Day of March, 2022

Drew Hirshfeld  
*Performing the Functions and Duties of the*  
*Under Secretary of Commerce for Intellectual Property and*  
*Director of the United States Patent and Trademark Office*